(12) United States Patent
Kokubo et al.

(10) Patent No.: US 7,798,679 B2
(45) Date of Patent: Sep. 21, 2010

(54) LIGHT EMITTING DEVICE AND LIGHTING DEVICE HAVING THE SAME

(75) Inventors: Fumio Kokubo, Nara (JP); Masao Yamaguchi, Saitama (JP)

(73) Assignees: Sharp Kabushiki Kaisha, Osaka (JP); Enplas Corporation, Kawaguchi-shi (JP)

(*) Notice: Subject to any disclaimer, the term of this patent is extended or adjusted under 35 U.S.C. 154(b) by 222 days.

(21) Appl. No.: 12/228,005

(22) Filed: Aug. 8, 2008

(65) Prior Publication Data

US 2009/0052192 A1 Feb. 26, 2009

(30) Foreign Application Priority Data

Aug. 9, 2007 (JP) ............... 2007-208656

(51) Int. Cl.
*F21V 5/04* (2006.01)

(52) U.S. Cl. ............... 362/335; 362/340; 362/334

(58) Field of Classification Search ......... 362/335, 362/340, 334, 326, 336, 337, 338, 307, 308, 362/309, 311.06–311.09, 311.1, 331
See application file for complete search history.

(56) References Cited

U.S. PATENT DOCUMENTS

| | | | | |
|---|---|---|---|---|
| 4,609,978 | A * | 9/1986 | Hsieh et al. ............... | 362/335 |
| 7,273,299 | B2 * | 9/2007 | Parkyn et al. ............. | 362/244 |
| 7,348,723 | B2 * | 3/2008 | Yamaguchi et al. ......... | 362/335 |
| 7,422,347 | B2 * | 9/2008 | Miyairi et al. ............ | 362/335 |
| 7,465,074 | B2 * | 12/2008 | Blumel ..................... | 362/335 |
| 2006/0066218 | A1 | 3/2006 | Yamaguchi et al. | |
| 2006/0083000 | A1 | 4/2006 | Yoon et al. | |
| 2008/0100773 | A1 | 5/2008 | Hwang et al. | |

(Continued)

FOREIGN PATENT DOCUMENTS

CN 1595255 3/2005

(Continued)

*Primary Examiner*—Bao Q Truong
(74) *Attorney, Agent, or Firm*—Edwards Angell Palmer & Dodge LLP; David G. Conlin; Catherine J. Toppin

(57) ABSTRACT

A light-emitting device (10) is arranged such that (x) $R_1$ monotonically decreasing as $\alpha_1$ increases, at least in a range of $\alpha_1 < \pi/3$, where an intersection of a light axis Z and an emission surface of a light-emitting element (1) is a reference point; $\alpha_1$ is an angle between the light axis Z and a straight line that passes through the reference point and an arbitrary point on a light-incoming surface (2a), and $R_1$ is a distance between the reference point and the arbitrary point on the light-incoming surface (2a); (y) $R_2$ monotonically increasing as $\alpha_2$ increases, at least in a range of $\alpha_2 < \pi/3$, where $\alpha_2$ is an angle between the light axis Z and a straight line that passes through the reference point and an arbitrary point on a light-outgoing surface (2b), and $R_2$ is a distance between the reference point and the arbitrary point on the light-outgoing surface (2b); and (z) $A_2$ scatters light without generating uneven brightness on a liquid crystal display panel and has higher scattering ability that is obtained by decreasing a reflectance caused by the Fresnel reflection, where n is a refraction index of a material forming a light flux controlling member (2), and $A_2 = \Delta R_2 / (R_2 \Delta \alpha_2)$, where $\Delta R_2$ is an increment of $R_2$ and $\Delta \alpha_2$ is an increment of $\alpha_2$.

7 Claims, 17 Drawing Sheets

U.S. PATENT DOCUMENTS

2008/0137331 A1 6/2008 Kaneko et al.
2009/0279312 A1 11/2009 Yoon et al.

FOREIGN PATENT DOCUMENTS

| | | |
|---|---|---|
| JP | 2008-147453 A | 6/2008 |
| KR | 10-2006-0034021 A | 4/2006 |
| KR | 10-2007-0090323 A | 9/2007 |
| KR | 10-2008-0038925 A | 5/2008 |

* cited by examiner

LIGHT EMITTING DEVICE AND LIGHTING DEVICE HAVING THE SAME

This Nonprovisional application claims priority under 35 U.S.C. §119(a) on Patent Application No. 208656/2007 filed in Japan on Aug. 9, 2007, the entire contents of which are hereby incorporated by reference.

FIELD OF THE INVENTION

The present invention relates to a light-emitting device and a lighting device having the same, and more particularly, relates to: a light-emitting device (i) having a light flux controlling member and a lighting device having this light-emitting device, which are capable of being used as, for example, a light source for use in a backlight that performs planar irradiation to a liquid crystal display panel from a back surface side of the liquid crystal display panel and an ordinal interior lighting.

BACKGROUND OF THE INVENTION

Conventionally, it has been known to use a surface light source device using plural light-emitting diodes (hereafter, referred to as "LED," as appropriate) as lighting means for irradiating a liquid crystal display monitor for use in a personal computer, a television, and the like. The surface light source device has the plural light-emitting diodes provided in a matrix manner in a tabular region having substantially the same shape as a liquid crystal display panel of the liquid crystal display monitor. The surface light source device performs planar irradiation to the liquid crystal display monitor from a back surface side of the liquid crystal display monitor, with light from the light-emitting elements. In the surface light source device, a brightness distribution of which light has been made substantially uniform by the light flux controlling member.

An example of the lighting device using LED as the light source is a lighting device 100 disclosed in Patent document 1. FIG. 19 is a cross-sectional view of the conventional lighting device 100. The lighting device 100 includes a light-emitting element 101 on a backside surface 102*c* and also a light flux controlling member 102 around the light-emitting element 101 that changes a direction of light emitted from the light-emitting elements 101. A liquid crystal display panel 106 is provided above the lighting device 100. The lighting device 100 is arranged such that the light from the light flux controlling member 102 is incident on the liquid crystal display panel 106 with a substantially even brightness distribution.

Specifically, the light flux controlling member 102 has a shape in which (i) angles $\phi_1$ and $\phi_2$ satisfy a formula of $\phi_2/\phi_1 > 1$ and (ii) a value obtained by the formula gradually decreases as $\phi_1$ increases, where: the angle $\phi_1$ is an angle between a light axis Z and the light emitted from the light-emitting element 101, entering a light incoming surface 102*a* of the light flux controlling member 102, and reaching a light outgoing surface 102*b* of the light flux controlling member 102; and the angle $\phi_2$ is an angle between the light axis Z and light L emitted from the light outgoing surface 102*b*.

By arranging the light outgoing surface 102*b* as described above, it is possible to smoothly broaden a light flux of the light emitted from the light-emitting element 101 over a wide range of the liquid crystal display panel 106. That is, light from the light-emitting elements 101 becomes readily blendable when a plurality of the light-emitting elements 101 are used as light sources. Thus, (i) even if there are variations in emission colors from the light-emitting elements 101, such variations are less detectable after being emitted via the light flux controlling member 102 and (ii) a brightness of the outgoing light becomes uniform. This allows realizing a surface light source device of high quality.

Another example of the light-emitting device using the LED as the light source is a light-emitting device disclosed in Patent document 2.

The lighting device in the Patent document 2 is arranged such that a light flux controlling member is formed by a bottom surface, a first surrounding curved surface extending from the bottom surface, and a first inner curved surface extending from the first surrounding curved surface, wherein a distance from a center of the bottom surface to an arbitrary point on the first inner curved surface is shorter than a radius of curvature at the arbitrary point on the first central curved surface. By arranging the first inner curved surface as described above, it is possible to broaden a light flux of light emitted from a light-emitting element over a wide range of a liquid crystal panel.

The lighting device in the Patent document 2 further has an empty space in the center of the bottom surface. Internal surfaces of the empty space are formed of a second surrounding curved surface and a second inner curved surface, wherein a distance from the center of the bottom surface to an arbitrary point on the second inner curved surface is longer than a radius of curvature at the arbitrary point on the second inner curved surface. By arranging the second inner curved surface as described above, it is possible to broaden the light flux of the light from the light-emitting element over the wide range of the liquid crystal panel.

The lighting device in the Patent document 2 further includes a conical recession at the center of the first inner curved surface such that the light flux, emitted from the light-emitting element into a direction more parallel to a light axis direction, is refracted into a direction away from the light axis direction.

(Patent Document 1)
Japanese Unexamined Patent Publication No. 2006-92983 (Tokukai 2006-92983) (published on Apr. 6, 2006)
(Patent Document 2)
Japanese Unexamined Patent Publication No. 2006-114863 (Tokukai 2006-114863) (published on Apr. 27, 2006)

However, the aforesaid conventional lighting devices cause the following problems, respectively.

In the light-emitting device 100 disclosed in the Patent document 1, the light flux controlling member 102 requires to have higher scattering ability, as a distance from the light-emitting element 101 to the liquid crystal display panel 106 becomes shorter or as a distance from the light-emitting element 101 to a neighboring light-emitting element becomes longer.

In order to improve the scattering ability of the light flux controlling member 102, it is necessary that the light emitted from the light-emitting elements 101 reach a position away from an area directly above the light-emitting elements 101, on the liquid crystal display panel 106. In order to obtain such light, it is necessary to refract the outgoing light as parallel to the liquid crystal display panel 106 as possible, on the light outgoing surface 102*b*. That is, it is necessary to significantly refract the light, on the light outgoing surface 102*b*. However, significant light refraction by the light outgoing surface 102*b* generally increases a reflex amount, due to a phenomenon called the Fresnel's reflection. That is, an amount of the light emitted from the light outgoing surface 102*b* decreases. In particular, the Fresnel's reflection effect becomes significant in the light-emitting device 100 disclosed in the Patent document 1 since the light-emitting device 100 is arranged such that control of the light direction is mainly performed at the light outgoing surface 102b, thereby having a need for further significantly refracting the light on the light outgoing surface 102b so that the higher scattering ability is obtained.

Furthermore, as shown by the arrow direction indicated by the dished line in FIG. 19, the light thus reflected on the light outgoing surface 102b is then reflected by a backside surface 102c of the light flux controlling member 102 or by a reflecting member 103 arranged in contact with the backside surface 102c. Then, the light is condensed in the vicinity of the area directly above the light-emitting element 101. As a result of the above, even if the refraction angle is set larger so as to obtain the higher light scattering ability of the light flux controlling member 102, (i) the amount of the light arranged to reach the position away from the area directly above the light-emitting element decreases after all, and (ii) the light is condensed in the area directly above the light-emitting element 101. As such, it becomes harder to obtain the higher scattering ability.

Furthermore, the Patent document 1 discloses the following as to the arrangement of the light flux controlling member 102: where (i) $\delta 1$ is a constant value of not more than $\pi/2$ and (ii) $\alpha$ is a coefficient of scattering ability of the light flux controlling member 102, a relation between $\phi_1$ and $\phi_2$ is expressed by a relation expression of $\phi_2 = (1+(\delta 1-\phi_1) \times \alpha / \delta 1) \times_1$.

FIG. 20 is a graph showing the relation between the angles $\phi_1$ and $\phi_2$ of the light emitting device 100. As shown in FIG. 20, when scattering ability larger than that of the light-emitting device 100 disclosed in Embodiment of the Patent document 1 is required, a region where the angle $\phi_1$ is relatively small has a region where an increase of the angle $\phi_1$ does not change the $\phi_2$ FIG. 21 illustrates a direction of emission expressed by the relational equation in FIG. 20. In the region shown in FIG. 20 where the increase of the $\phi_1$ does not change the $\phi_2$, (i) the directions of emission overlap each other and (ii) the outgoing light fluxes are concentrated, as shown in FIG. 21, thereby causing a bright line of a ring-shape. Thus, uneven brightness is generated. In order to prevent the generation of such uneven brightness, it is necessary to use the light flux controlling member 102 having $\alpha < 1$. However, under such a requirement, there may be a case where the light-emitting device 100 is unsatisfactory in the view of obtaining the higher scattering ability. That is, there may be a case where it is unsatisfactory, in the view of obtaining the larger scattering ability, to simply form the light flux controlling member in the shape in which the value of the $\phi_2/\phi_1$ gradually decreases as $\phi_1$ increases.

In the light-emitting device disclosed in the Patent document 2, the radius of curvature is significantly changed at an interface of the first inner curved surface and the first surrounding curved surface such that the light is refracted toward the light axis on the surrounding curved surface. As a result, the light emitted in the vicinity of the interface is condensed, thereby resulting in the generation of the ring-shaped bright line. In order to prevent the generation of the bright line, it is proposed in an Embodiment to use a type of a light-emitting device that does not have the first surrounding curved surface. However, this arrangement has a lens that is remarkably large, thus not being practical. The reason of this can be explained as follows. The lens becomes larger in an arrangement in which a distance from a center of a bottom surface to an arbitrary point on a first inner curved surface is set shorter than a radius of a curvature at the arbitrary point on the first inner curved surface. As such, a first surrounding curved surface is necessary to be provided.

Furthermore, it is described in the Patent document 2 that the lighting device may have a first surrounding curved surface, an inner curved surface, and a most-inner curved surface. However, the most-inner curved surface has conical geometry, thereby refracting, into a direction away from the light axis, light emitted in a light axis direction from the center of a bottom surface. In this case, it gets darker on the light axes of the light flux controlling members, causing spot-like uneven brightness. Thus, with the invention disclosed in the patent document 2, it is difficult to prevent the uneven brightness, though it is possible to scatter the light with the invention.

SUMMARY OF THE INVENTION

The present invention is made in the view of the problem, and an object of the invention is to realize a light-emitting device that (i) scatters light without generating uneven brightness on a liquid crystal display panel and (ii) has higher scattering ability that is obtained by decreasing a reflectance caused by the Fresnel's reflection.

In order to attain the object, a light-emitting device, comprises a light-emitting element and a light flux controlling member for controlling light emitted from the light-emitting element, the light flux controlling member having (i) a light-incoming surface from which the light from the light-emitting element enters the light flux controlling member and (ii) a light-outgoing surface from which the light being incident on the light-incoming surface is emitted from the light flux controlling member, the light-incoming surface having a concave curve part that is axisymmetrical with respect to a reference light axis of the light-emitting device, and the light-outgoing surface having (i) a convex curve part that is axisymmetrical with respect to the reference light axis and (ii) a recession continuing to the convex curve part, on a part encompassing an intersection of the reference light axis and the light-outgoing surface; and $R_1$ monotonically decreases as $\alpha_1$ increases, at least in a range of $\alpha_1 < \pi/3$, where an intersection of the reference light axis and an emission surface of the light-emitting element is a reference point, $\alpha_1$ is an angle between the reference light axis and a straight line that passes through the reference point and an arbitrary point on the light-incoming surface, and $R_1$ is a distance between the reference point and the arbitrary point on the light-incoming surface; $R_2$ monotonically increases as $\alpha_2$ increases, at least in a range of $\alpha_2 < \pi/3$, where $\alpha_2$ is an angle between the reference light axis and a straight line that passes through the reference point and an arbitrary point on the light-outgoing surface, and $R_2$ is a distance between the reference point and the arbitrary point on the light-outgoing surface; and $A_2 < 1/\sqrt{n^2-1}$, where n is a refraction index of a material forming the light flux controlling member, and $A_2 = \Delta R_2/(R_2 \Delta \alpha_2)$, where $\Delta R_2$ is an increment of $R_2$ and $\Delta \alpha_2$ is an increment of $\alpha_2$.

According to the above invention, the distance between the reference point and the arbitrary point on the light-incoming surface monotonically decreases, as the angle between the reference light axis and the straight line that passes through the reference point to the arbitrary point on the light-incoming surface increases. As such, the light is refracted, on the light-incoming surface, into a direction away from the light axis. Furthermore, the distance between the reference point and the arbitrary point on the light-outgoing surface monotonically increases, as the angle between the reference light axis and the straight line that passes through the reference point to the arbitrary point on the light-outgoing surface increases. As such, the light is further refracted, on the light-outgoing surface, into a direction away from the light axis. In the above cases, the distances monotonically increase and decrease in the range of π/3, a brightness range of a half or more amount of the brightness of the light emitted into the light axis direction from the ordinary light emitting element. Thus, it is possible to scatter the light with hardly generating the uneven brightness. Besides, it is possible to prevent the total reflection on the light-outgoing surface since $A_2$ is the value less than $1/\sqrt{n^2-1}$. Thus, the cause of the uneven brightness is prevented. An example of the uneven brightness encompasses such as no light emission on a part of the light-outgoing surface.

Additional objects, features, and strengths of the present invention will be made clear by the description below. Further, the advantages of the present invention will be evident from the following explanation in reference to the drawings.

DESCRIPTION OF THE EMBODIMENTS

Embodiment 1

Figure 1:
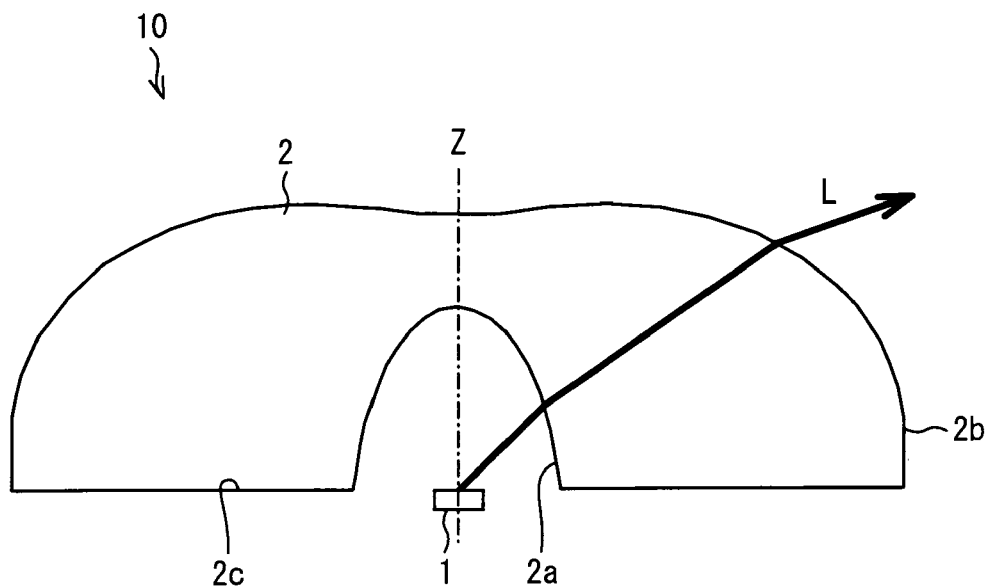
FIG. 1 is a cross-sectional view illustrating an embodiment of a light-emitting device in accordance with the present invention.

One embodiment of the present invention is described below with reference to FIGS. 1 through 9. FIG. 1 is a cross-sectional view illustrating a light-emitting device 10 in accordance with the present embodiment. The light-emitting device illustrated in FIG. 1 includes a light-emitting element 1 and a light flux controlling member 2 arranged to surround and cover the light-emitting element 1. A direction of a light axis Z (a reference light axis) indicates a direction in which light proceeds three-dimensionally at a center of an outgoing light flux of light that is emitted from the light-emitting element 1. For convenience, in FIG. 1, a direction vertical to the light-emitting element 1 is set as the light axis (the reference light axis) Z.

Furthermore, the light-emitting device 10 has a rotation-symmetrical shape with respect to the light axis Z. However, the light-emitting element 1 does not necessarily have a rotation-symmetrical shape. Alternatively, the light-emitting element 1 may have a rectangular solid shape or the like. A light flux controlling member 2 changes a direction of light L emitted from the light-emitting element 1. That is, the light flux controlling member 2 refracts the light L more parallel to a direction perpendicular to the light axis Z so as to scatter the light L.

The light flux controlling member 2 is a member for changing the direction of the light emitted from the light-emitting element 1. The light flux controlling member 2 is not particularly limited. However, the light flux controlling member 2 is preferably made from transparent material having a refraction index of not less than 1.45 and not more than 1.65. In addition, it is further preferable that the light flux controlling member 2 is made from transparent resin material or a transparent glass. Examples of such transparent resin material are polymethylmethacrylate (PMMA) having a refraction index of 1.49, polycarbonate (PC) having a refraction index of 1.59, epoxy resin (EP) and the like.

The light flux controlling member 2 has a light-incoming surface 2a as an internal surface, an light-outgoing surface 2b as an external surface, and a bottom surface 2c that interconnects the light-incoming surface 2a and the light-outgoing surface 2b to each other. The light flux controlling member 2a has an empty space therein, and the light-emitting element 1 is provided in that empty space. The light-emitting element 1 is a member that emits light to its surroundings, with the light axis Z at a center of the light emission. The light-emitting device 1 is not particularly limited, and a conventional LED chip can be used as the light-emitting element.

The light-incoming surface 2a is the internal surface of the light flux controlling member 2. As illustrated in FIG. 1, the light-incoming surface 2a has a cross-sectional surface whose counter intersects the light axis Z substantially vertically on the light axis Z, but significantly changes its slope in the vicinity of the light axis Z. The slope of the counter of the light-incoming surface 2a changes less in an area away from the light axis Z. As such, the light-incoming surface 2a has the cross-sectional surface of a bell shape. On the other hand, the light-outgoing surface 2b, which is the outer surface of the light flux controlling member 2, has a cross-sectional surface whose counter has a substantially vertical to the light axis Z and changing less in the vicinity of the light axis Z, This slope of the counter of the light-outgoing surface 2b significantly changes in an area away from the light axis Z to be gradually parallel to the light axis Z. As such, the light-outgoing surface 2b has the cross-sectional surface of a recession shape in the vicinity of the light axis Z.

Figure 2:
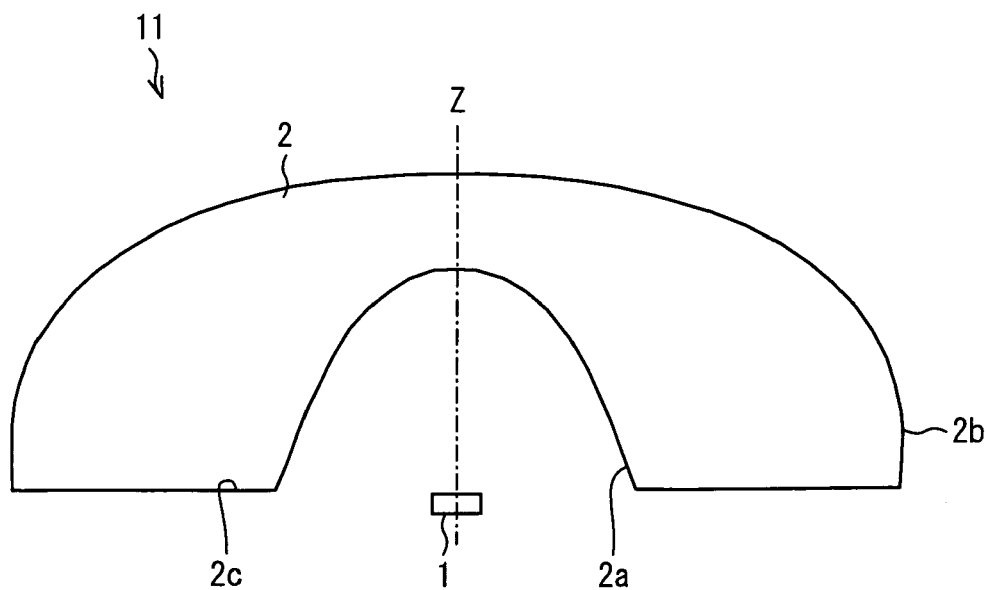
FIG. 2 is a cross-sectional view illustrating an embodiment of the light-emitting device in accordance with the present invention.

FIG. 2 illustrates the cross-sectional view of a light-emitting device 11 in accordance with the present embodiment. According to the present embodiment, a light direction is changed on both a light-incoming surface 2a and a light-outgoing surface 2b. As such, it is possible to form the light-outgoing surface 2b in a convex shape in the vicinity of the light axis Z, as shown in FIG. 2.

Figure 19:
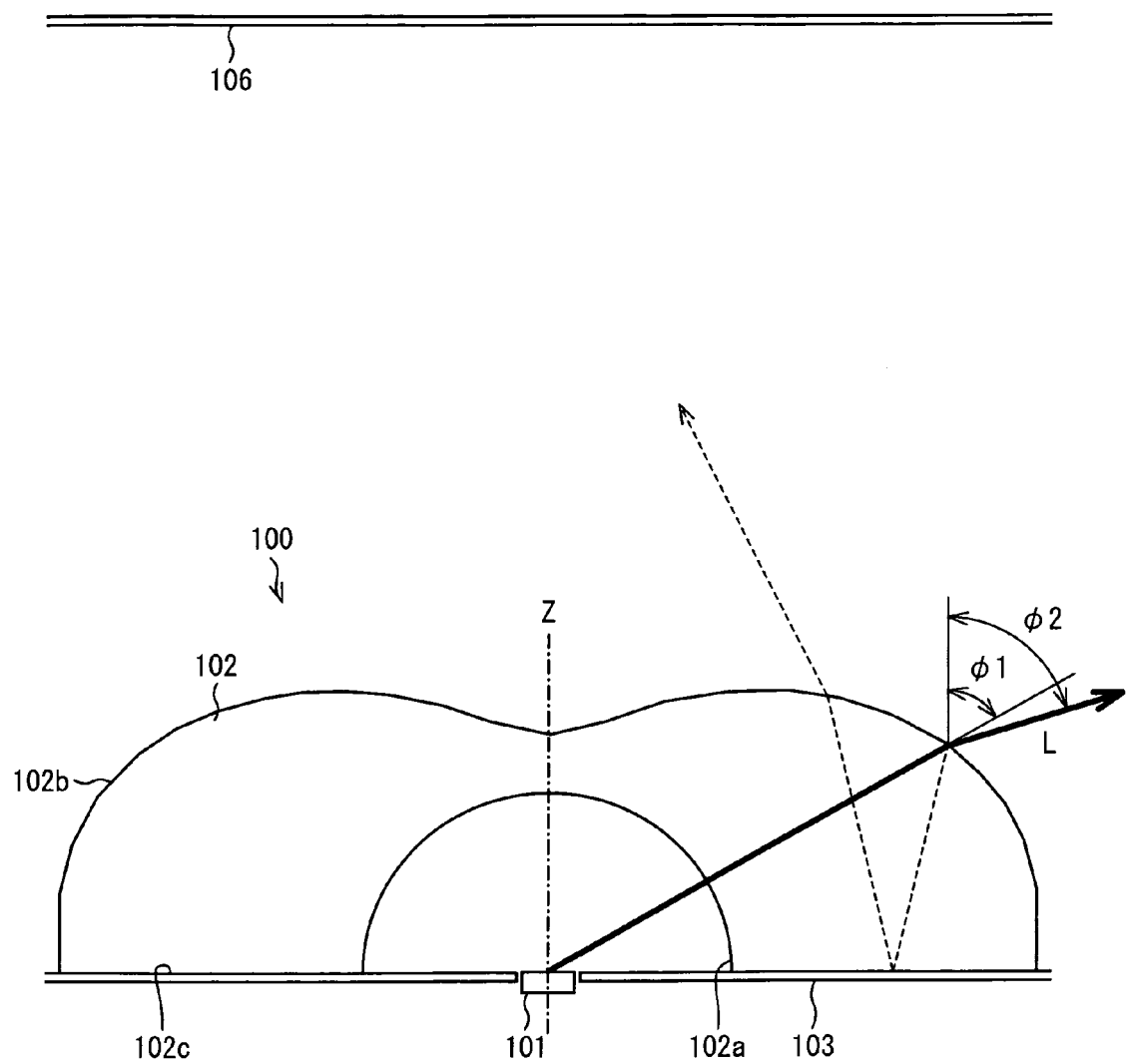
FIG. 19 is a cross-sectional view illustrating a conventional light-emitting device.

FIG. 19 illustrates a light-emitting device 100 disclosed in the Patent document 1. With light-emitting device 100, the light direction is changed solely on a light-outgoing surface 102b. As such, the light-outgoing surface 102b is formed in a concave shape in the vicinity of the light axis Z. On the other hand, according to the present invention, the light-outgoing surface 102b of the light-emitting device is not limited to a concave shape, unlike the light-emitting device 100. Alternatively, the light-outgoing surface 102b may also be arranged in convex and concave shapes as in the light-emitting device 10 and the light emitting device 11, respectively. As such, a degree of freedom in designing can be higher.

Figure 3:
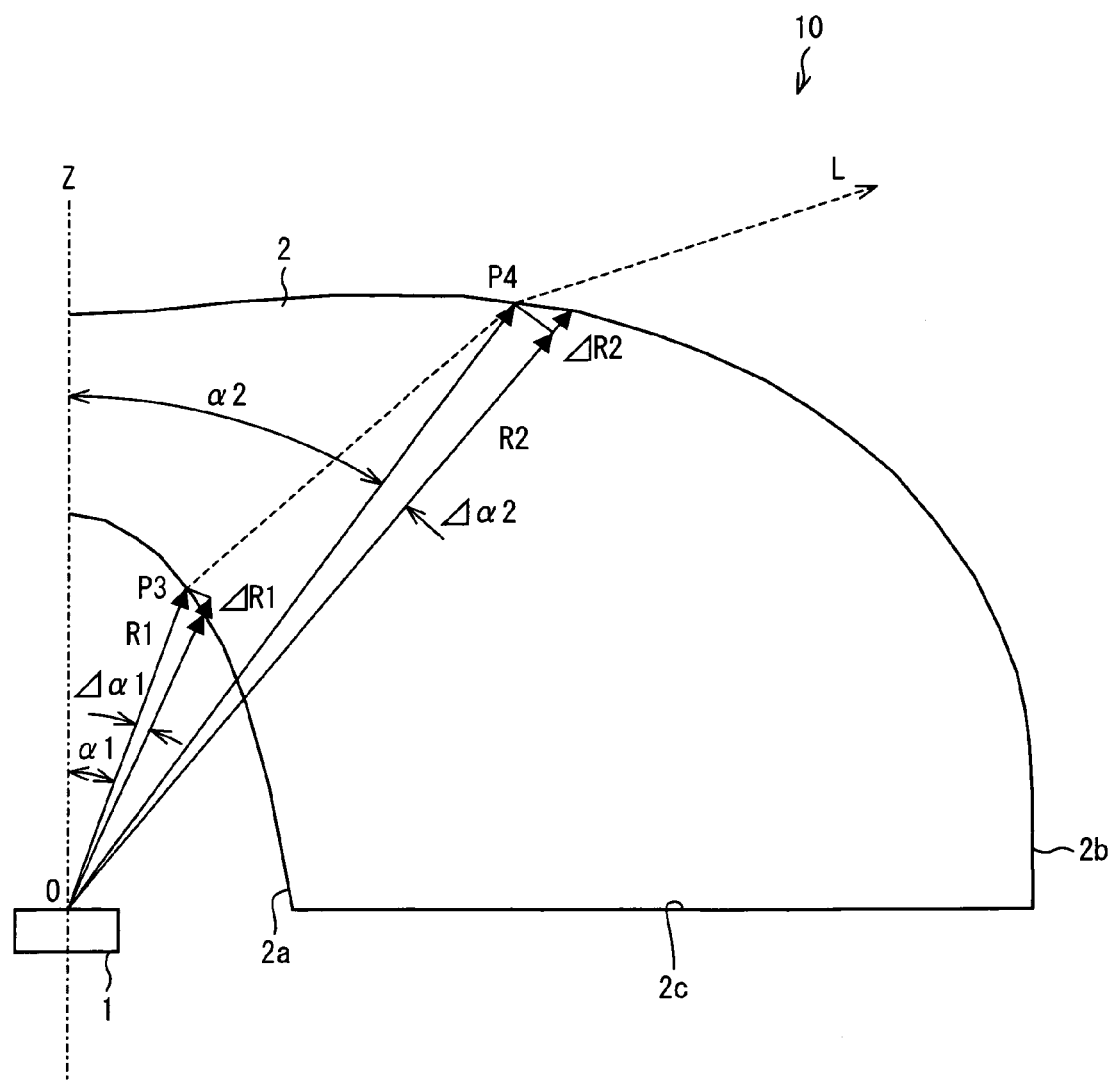
FIG. 3 is a cross-sectional view closely illustrating the light-emitting device illustrated in FIG. 1.

Then, with reference to FIG. 3, the following description explains an arrangement in which a direction of the light L is changed on the light-outgoing surface 2b of the light flux controlling member 2. FIG. 3 is a cross-sectional view illustrating a part of the light-emitting device 10 illustrated in FIG. 1.

In FIG. 3, the light-incoming surface 2a has the concave curve section that is axisymmetrical with respect to the reference light axis Z of the light-emitting device 10. If the intersection point of the reference light axis Z and the emission plane is set as the reference point O, then $\alpha_1$ indicates the angle between the reference light axis Z and the straight line that passes through the reference point O to point $P_3$ on the light-incoming surface 2a, and $R_1$ indicates a distance between the arbitrary point $P_3$ and the reference point O. In a case of the Lambertian distribution, which is a light distribution property of an ordinary light-emitting element, $R_1$ monotonically decreases as $\alpha_1$ increases, at least in the range of $\alpha_1 < \pi/3$, the brightness range of not less than the half amount of the brightness of the light emitted in the light axis direction.

In the specification of the present application, radian is used as an angle notation unless otherwise noted. The light-outgoing surface 2b has (i) a convex curve part that is axisymmetrical with respect to the reference light axis Z and (ii) a recession continuing to the convex curve part at an area encompassing the intersection of the light-outgoing surface 2b and the reference light axis Z. Where (i) $\alpha_2$ is an angle between the reference light axis Z and a straight line that passes through the reference point O to arbitrary point $P_4$ on the light-outgoing surface 2b and (ii) $R_2$ is a distance between the reference point O and point $P_4$ on the light-outgoing surface 2b, $R_2$ monotonically increases as $\alpha_2$ increases, at least in the range of $\alpha_2 < \pi/3$.

In the above, the light L having been incident on the light-incoming surface 2a is outwardly refracted. Then, the light L is further refracted when emitted from the light-incoming surface 2b. The following description explains a principle of this. Assume that, at point $P_3$ on the light-incoming surface 2a the light-incoming surface has a shape, in which the increase of $\alpha_1$ does not change $R_1$, that is, an increment $\Delta R_1$, by which $R_1$ increases with respect to an increment $\Delta \alpha_1$ of $\alpha_1$, is equal to 0 in the cross-sectional view in FIG. 3. In this case, the light-incoming surface has a circular shape centering on the reference point O and having a radius of $R_1$. Thus, the light is vertically incident on the light-incoming surface. As such, the light is transmitted without being deflected.

On the other hand, assume that the light-incoming surface has a shape in which $R_1$ decreases as $\alpha_1$ increases, that is, the increment $\Delta R_1$, by which $R_1$ increases with respect to the increment $\Delta \alpha_1$ of $\alpha_1$, is expressed by $\Delta R_1 < 0$, in the cross-sectional view in FIG. 3. In this case, a tangent line at the point $P_3$ on the light-incoming surface 2a becomes more parallel to the light axis Z than an arc of the circle that centers on the reference point O and has the radius of $R_1$. As such, the light emitted from the reference point O and entering the arbitrary point $P_3$ is refracted into a direction away from the light axis and transmitted in the light flux controlling member 2. If it is set to be $\Delta R_1/R_1 \Delta \alpha_1 = A_1$ in the above, then $A_1$ is expressed by $A_1 < 0$.

On the light-outgoing surface 2b, conversely, $R_2$ increases as $\alpha_2$ increases. As such, a tangent line at the point $P_4$ on the light-outgoing surface 2b is more perpendicular to the light axis Z than a tangent line of a circle that centers on the reference point O and a radius of $R_2$. Thus, the light, which is incident on the point $P_4$ from the direction in which the straight line passes through the reference point O to the point $P_4$, is further refracted into the direction away from the light axis Z. In practice, since the light-incoming surface 2a is provided, an angle between (i) the light L having entering the point $P_4$ and (ii) a normal line at the point $P_4$ is larger than that between (i) the normal line at the point $P_4$ and (ii) the straight line that passes through the point $P_4$ to the reference point O, as shown in FIG. 3. Thus, the light is further refracted into the direction away from the light axis. As described above, it is possible to obtain the light-emitting device having the scattering property, by providing the light-emitting device with the light-incoming surface 2a and light-outgoing surface 2b having the above-described features.

Figure 4:
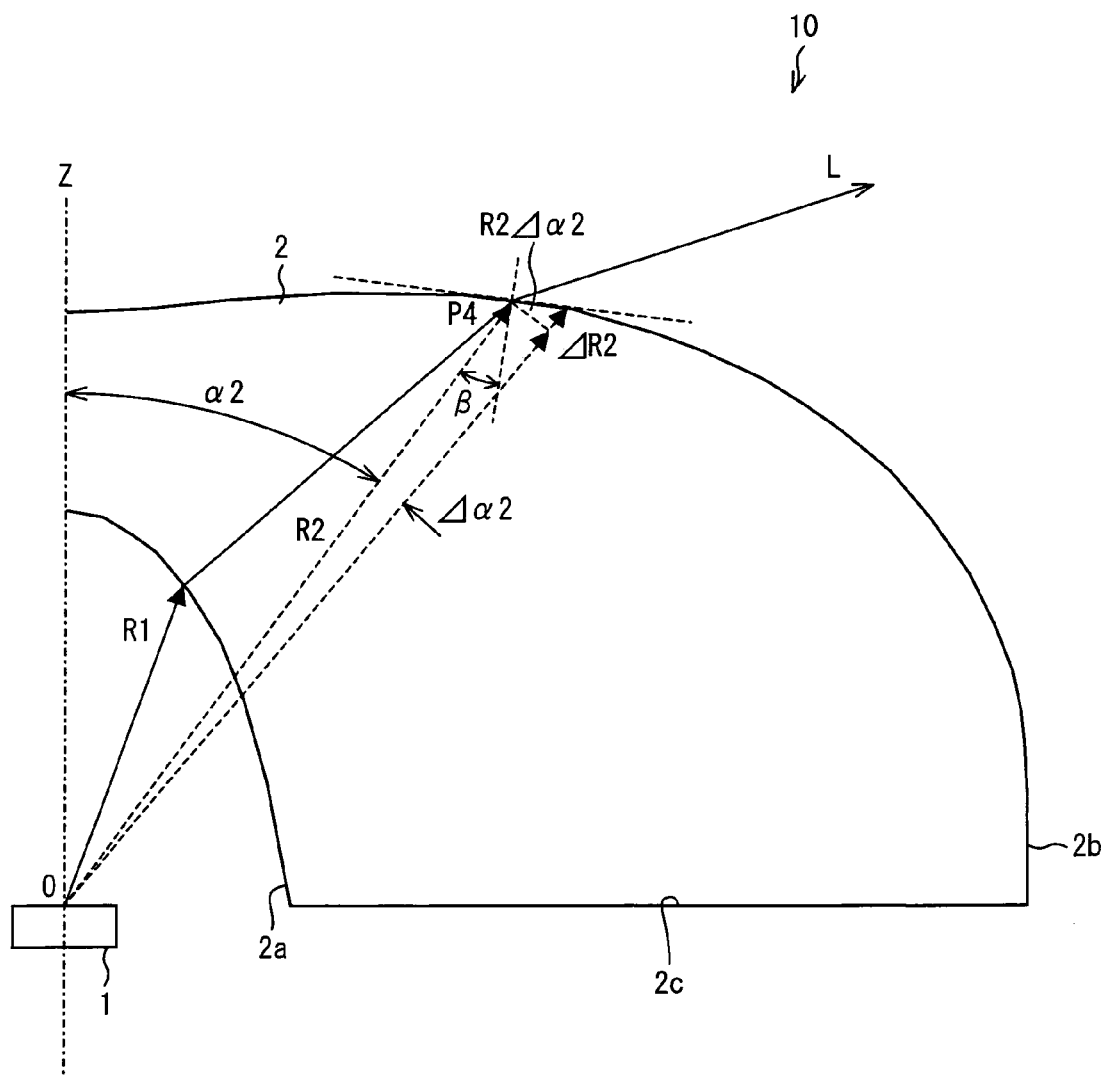
FIG. 4 is a cross-sectional view closely illustrating the light-emitting device illustrated in FIG. 1.

Next, the following description explains requirements for a light emission from a light-outgoing surface 2b, with reference to FIG. 4. First, the following description deals with a light flux that enters point $P_4$ from a direction in which a straight line passes through the reference point O to point $P_4$ on a light-outgoing surface.

Where (i) $\beta$ is an angle between a normal line at point $P_4$ and the straight line passing the reference point O to the point $P_4$ and (ii) $\Delta R_2$ is a variation of $R_2$ at a time when $\alpha_2$ changes by a minimal amount $\Delta \alpha_2$, $\tan \beta = \Delta R_2 / R_2 \Delta \alpha_2$. Then, where n is a refraction index, it is necessary to have the following equation of $n \sin \beta \leq 1$ in order to emit the light from the light-outgoing surface. If it is put that $\Delta R_2 / R_2 \Delta \alpha_2 = A_2$, then: $A_2 \leq 1/\sqrt{n^2 - 1}$. This should be satisfied for emitting, from the light-outgoing surface 2b, the light flux entering at the point P₄ from the direction in which the straight line passes through the reference point O to the point P₄ on the light-outgoing surface. This example deals with the case where the light emitted from the reference point O enters the light-outgoing surface 2b without being refracted on the light-incoming surface 2a. In practice, however, the light emitted from the reference point O is refracted on the light-incoming surface 2a. As such, an incident angle of the light to enter the point P₄ on the light-outgoing surface 2b becomes larger than the angle β. Thus, total reflection is always caused under the condition of:

$$A_2 > 1/\sqrt{n^2-1}.$$

As such, at least the following condition should be satisfied:

$$A_2 < 1/\sqrt{n^2-1}.$$

The above description deals with a case that does not assume $\alpha_1=0$ and $\alpha_2=0$. In a case of $\alpha_1=0$ and $\alpha_2=0$, light emitted in a light axis direction from a light-emitting element has to be emitted into the light axis direction. Thus, $A_1$ and $A_2$ become equal to 0. With this, it is possible to prevent the demerit in the Patent document 2 that it becomes darker in the area directly above the light-emitting element 1.

Figure 5:
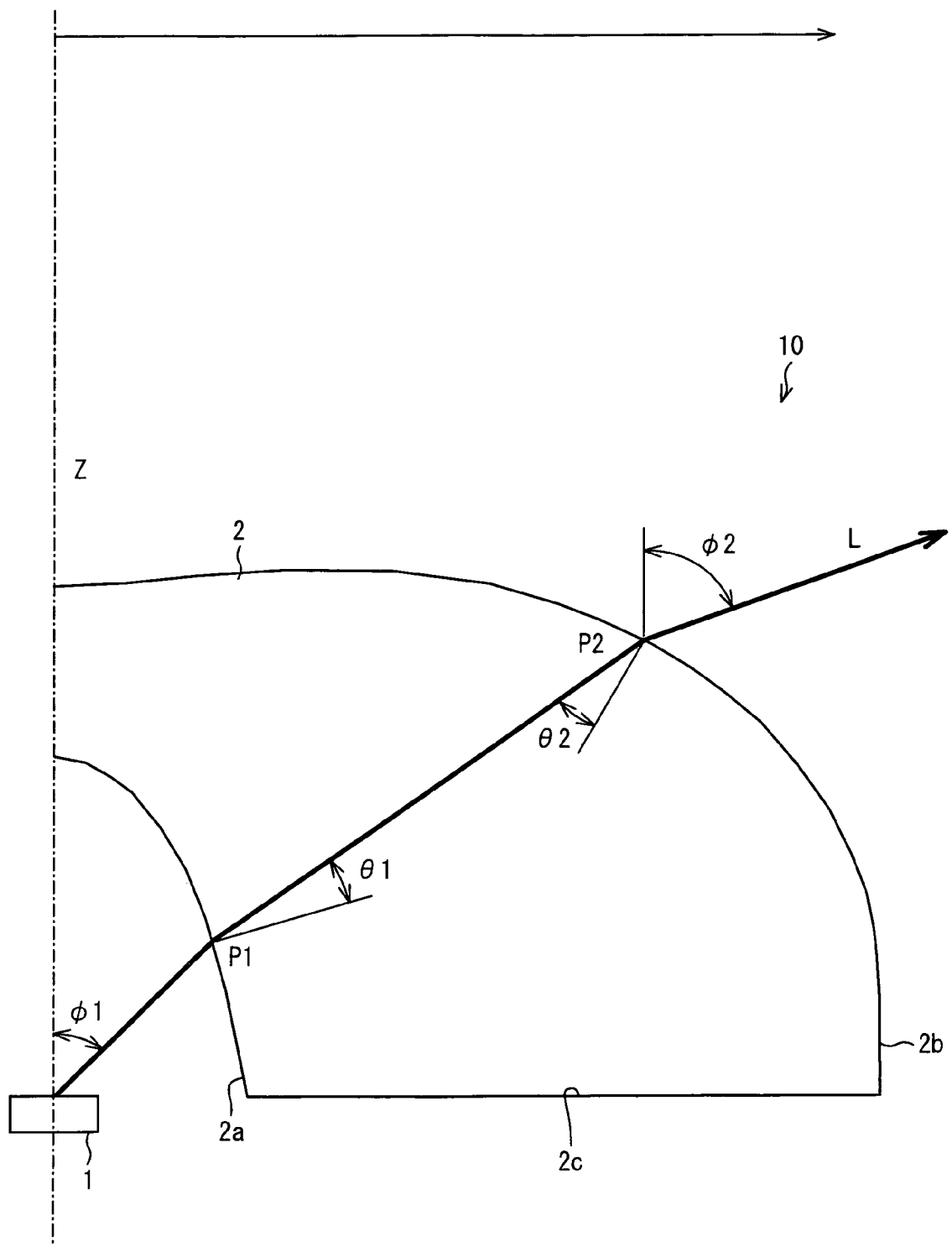
FIG. 5 is a cross-sectional view closely illustrating the light-emitting device illustrated in FIG. 1.

In FIG. 5, $\phi_1$ is an angle between the light axis Z and the light L emitted from the light-emitting element 1 and incident on the light-incoming surface 2a. $\phi_2$ is an angle between (i) the light L incident on the light-incoming surface 2a, entering the light-outgoing surface 2b, and emitted from the light-outgoing surface 2b and (ii) a line parallel to the light axis Z and passing through the emission point P₂ at which the light L enters on the light-outgoing surface 2b.

In addition, in FIG. 5, light-incoming point P₁ is a point via which the light L emitted from the light-emitting element 1 enters the light-incoming surface 2a, while θ₁ is an angle between the light L having entered from the light-incoming point P₁ and a normal line at the light-incoming point P₁. Also, a light-outgoing point P₂ is a point on an emission plane from which the light L, having been transmitted through the light flux controlling member 2 and entering the light-outgoing surface 2b, is emitted. θ₂ is an angle between the light L having entered the light-emission point P₂ and a normal line at the light-emission point P₂.

As shown in FIG. 5, the light L emitted from the light-emitting element 1 (i) enters the light-incoming surface 2a, then (ii) is transmitted through the light flux controlling member 2, and ultimately (iii) is externally emitted (e.g., the light is emitted to an air medium) from the light-outgoing surface 2b, by the Snell's law. In the above process, the light flux from the light-emitting element 1 is refracted into a direction away from the light axis Z and emitted from the light flux controlling member 2 of the present invention.

In order to prevent the uneven brightness by further improving the scattering property in the light-emitting device 10, it is considered to be preferable to arrange such that the light L emitted from the light-emitting element 1 is distributed in a similar manner as the Gaussian distribution, in which it becomes bright on the light axis of the light-emitting device 10, whereas it becomes darker as being away from the light axis Z. As such, the inventor conducted the diligent study and found, as a result, that the following requirements should be set out for light L emitted from a light-emitting element having a light distribution property $P(\phi_1)$.

That is, the inventor found it possible that the light L, emitted from the light-emitting element 1 having the light distribution property $P(\phi_1)$, is distributed with the Gaussian distribution on a plane, e.g., on a liquid crystal display panel, if the following equation (2) is satisfied:

$$\int P(\phi_1)\sin\phi_1 d\phi_1 = -Ae^{\frac{-r^2}{2\sigma^2}} + C \quad (2)$$

where, on the plane that is (i) provided away from the light flux controlling member 2 for a certain distance in the light axis Z direction and (ii) arranged perpendicular to the light axis Z, r is a distance between the plane and the light axis Z, $\phi_1$ is an angle between the light L and the light axis Z, C is a constant to satisfy $\phi_1=0$ when r=0; and σ is a constant indicative of a scattering property, and A is obtained by the following equation:

$$A = \int_0^{\frac{\pi}{2}} P(\phi_1)\sin\phi_1 d\phi_1. \quad (1)$$

As described above, it is possible to obtain the light L that is in the Gaussian distribution on the light liquid crystal panel, by the light-emitting element 1 satisfying the requirements. This allows preventing the generation of the ring-shaped bright line on the plane and/or the generation of the bright spot in the light-emitting device 10. Thus, it is possible to prevent the generation of the uneven brightness of the light L emitted from the light-emitting element 1.

The Lambertian distribution, expressed by a distribution property $P(\phi_1)=P_0 \cos \phi_1$ ($P_0$ is a constant) of an ordinary LED, is of a particular importance. The Lambertian distribution can be converted in the Gaussian distribution, on the plane (the liquid crystal display panel), if the following equation is satisfied:

$$\phi_1 = (1/2)\cos^{-1}\left(2e^{\frac{-r^2}{2\sigma^2}} - 1\right). \quad (3)$$

This further prevents the bright unevenness of the light L emitted from the light-emitting element 1.

72 According to the equations (1) and (2), when a distance between the light-emitting device 100 and the liquid crystal display panel 106 is set 20 mm in a light-emitting device 100 shown in FIG. 19, a lens shape of α=1, which is disclosed in the Patent document 1, corresponds approximately to that of σ=30 mm. This shows that with the shape of the light-emitting device 100 in the Patent document 1, it is difficult to further improve the scattering property.

Figure 6:
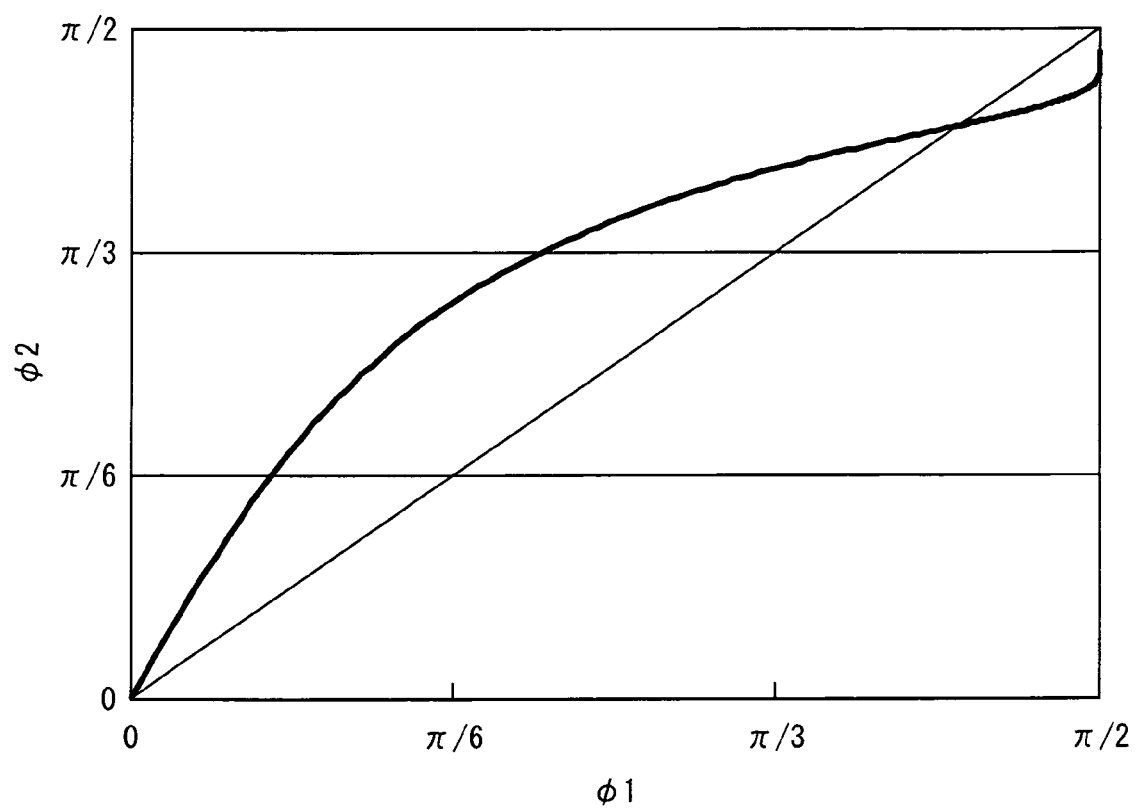
FIG. 6 is a graph showing a relation between angles $\phi_1$ and $\phi_2$ in a case where σ of the light-emitting device of the present invention is set 35 mm and a distance between the light-emitting device and a liquid crystal display panel is set 20 mm.
Figure 7:
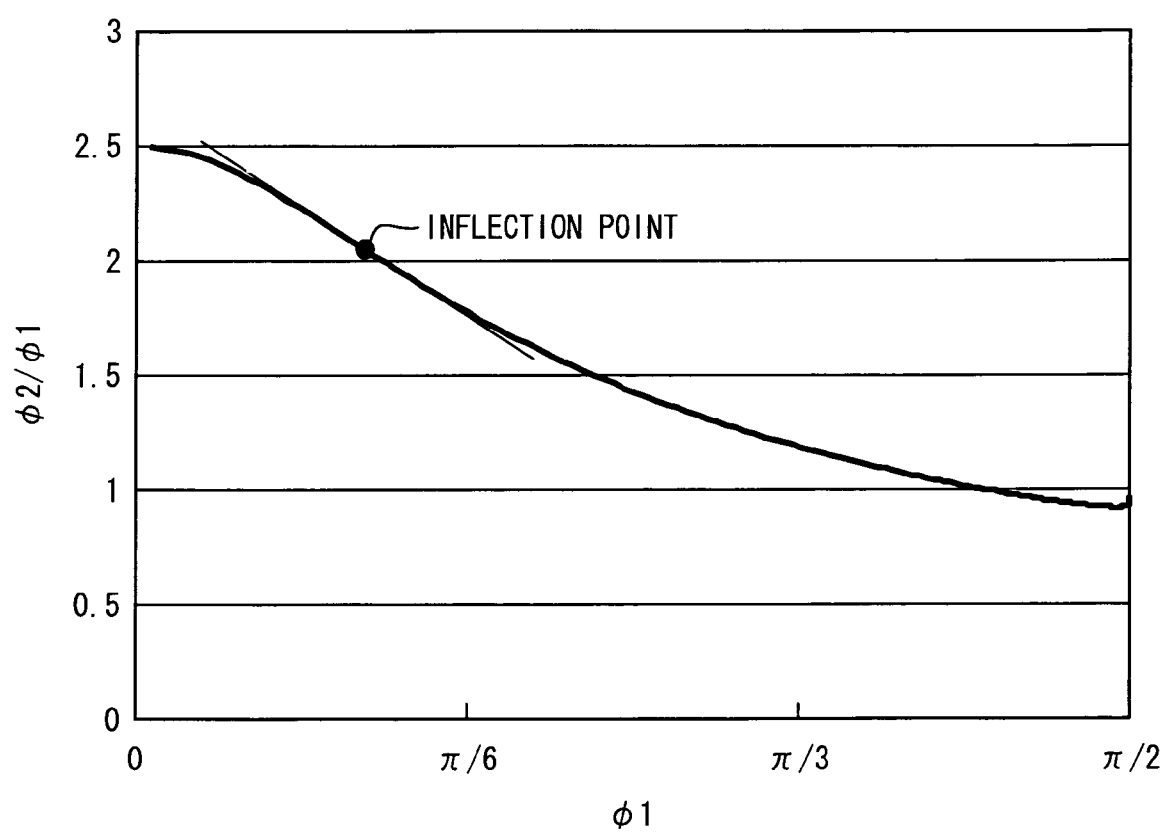
FIG. 7 is a graph showing a relation between an angle $\phi_1$ and an angle $\phi_2/\phi_1$ in a light-emitting device 10 illustrated in FIG. 5.
Figure 20:
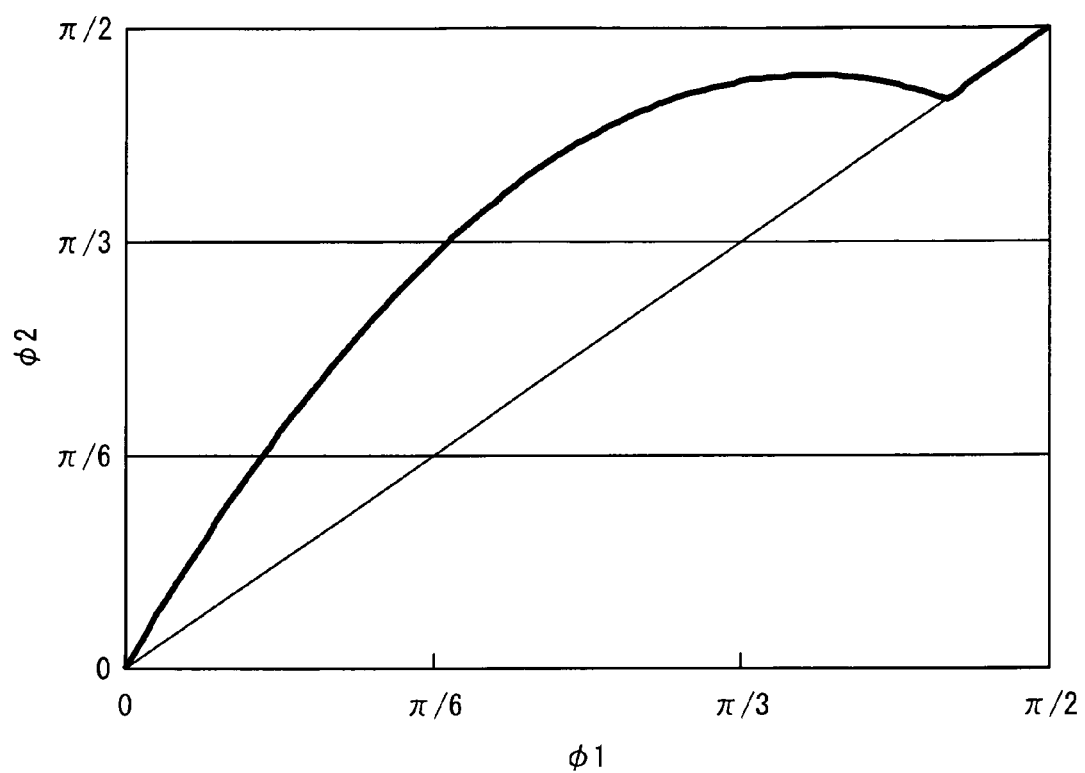
FIG. 20 is a graph showing a relation between angles $\phi_1$ and $\phi_2$ in the conventional light-emitting device illustrated in FIG. 19.
Figure 21:
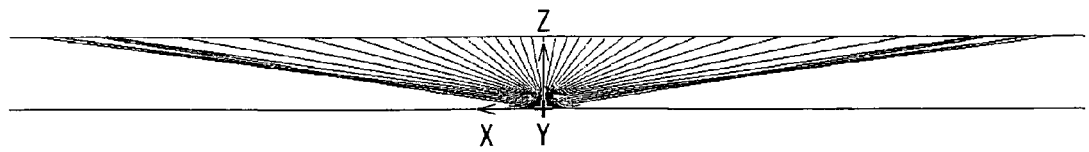
FIG. 21 is a view illustrating a direction in which a light beam is emitted in the conventional light-emitting device illustrated in FIG. 19.

FIG. 6 is a graph showing a relation between $\phi_1$ and $\phi_2$ in a case where σ is set 35 mm and a distance between the light-emitting device and the liquid crystal display panel is set 20 mm. As shown in FIG. 6, $\phi_2$ monotonically increases as $\phi_1$ increases. Thus, there is no such region as shown in FIG. 20 where the increase of $\phi_1$ does not change $\phi_2$. FIG. 7 is a graph showing a relation between $\phi_1$ and $\phi_2/\phi_1$ in the case of FIG. 6. As shown in FIG. 7, the relation between $\phi_1$ and $\phi_2/\phi_1$ is not linear. The graph in FIG. 7 shows there is an inflection point. On the other hand, the relation between $\phi_1$ and $\phi_2/\phi_1$ linearly changes in the designing method disclosed in the Patent document 1.

Figure 8:
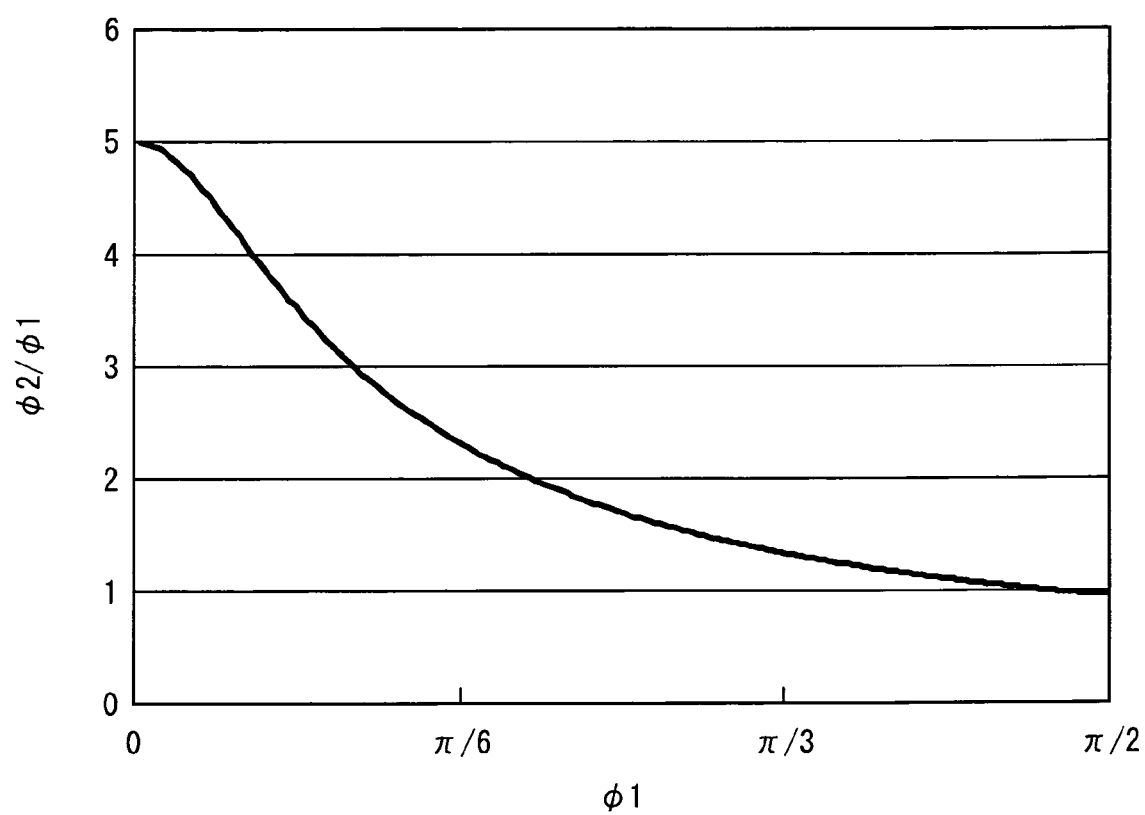
FIG. 8 is a graph showing a relation between angles $\phi_1$ and $\phi_2$ in a case where σ of the light-emitting device of the present invention is set 70 mm and a distance from the light-emitting device and a liquid crystal display panel is set 20 mm.

FIG. 8 shows a relation between $\phi_1$ and $\phi_2/\phi_1$ in a case where scattering property is further improved to be σ=70 mm.

FIG. 8 more clearly shows a difference between the present invention and the invention disclosed in the Patent document 1 by showing that, in the present invention, $\phi_2/\phi_1$ rapidly decreases as $\phi_1$ increases in a range where $\phi_1$ is small, whereas $\phi_2/\phi_1$ moderately decreases to 1 as $\phi_1$ increases in a range where $\phi_1$ is large.

Figure 9:
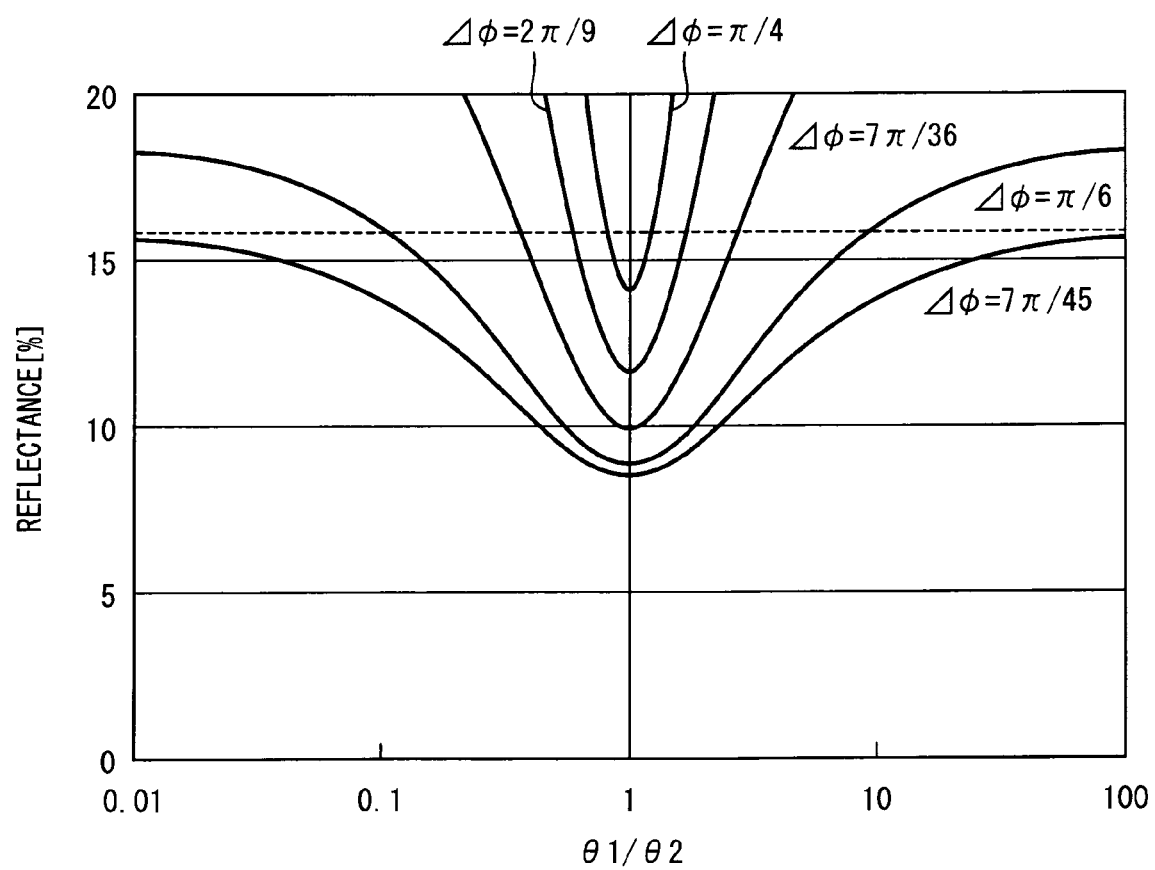
FIG. 9 is a graph showing a relation between angles $\theta_1/\theta_2$ and a reflectance in the light-emitting device of the present invention.

FIG. 9 is a graph showing a relation between $\theta_1/\theta_2$ and a reflectance in the light emitting device 10. In FIG. 9, the vertical axis indicates a reflectance, and the horizontal axis indicates $\theta_1/\theta_2$ in logarithm. The reflectance shown in FIG. 9 encompasses reflection on the light-incoming surface 2a and that on the light-outgoing surface 2b. In the conventional light-emitting device 100 shown in FIG. 19, $\theta_1/\theta_2$ is always set to be $\theta_1/\theta_2=0$ (in the light-emitting device 100, always $\theta_1=0$). A value of an asymptote to a curve in FIG. 9 shows a reflectance in the conventional technique. For example, the asymptote to the curve $\Delta\phi=7\pi/45$ is indicated by the dashed line having the reflectance of 15.8%. That is, the reflectance of 15.8% is obtained in the conventional technique in a case of $\Delta\phi=7\pi/45$.

Unlike the light-emitting device 100 in accordance with the conventional technique, the light-emitting device 10 in accordance with the present invention is arranged such that the direction of the light L is changed on both the light-incoming surface 2a and the light-outgoing surface 2b. As such, the reflectances of the curves are below the values of the asymptotes, respectively. This demonstrates that the light-emitting device 10 can further lower the reflectance, as compared to the light-emitting device 100. With $\Delta\phi$ being hold constant, a minimum reflectance can be obtained when $\theta_1/\theta_2=1$, that is, when $\theta_1=\theta_2$. This shows that the reflectance becomes larger as $\Delta\phi$ becomes larger.

In order for the light flux controlling member 2 to improve the scattering property of light L, the light emitted from the light-emitting element 1 should be refracted as closer to the direction perpendicular to the light axis X as possible. As such, it is necessary to obtain a large $\Delta\phi$. Besides, it is preferable to set the reflectance to 15% or below, since the inventor's analysis by ray tracing bore out that the scattering property becomes harder to be improved if the reflectance by the Fresnel's reflection on the light flux controlling member 2 is higher than 15% at a maximum. Taking the graph into consideration, requirements for having the reflectance 15% or below are expressed by the following equations (9) through (15):

$$\text{if } \Delta\phi \leq 3\pi/20, 0 \leq \theta_1/\theta_2 \leq \infty \quad \text{equation (9);}$$

$$\text{if } \Delta\phi = 7\pi/45, 1/25.8 \leq \theta_1/\theta_2 \leq 25.8 \quad \text{equation (10);}$$

$$\text{if } \Delta\phi = \pi/6, 1/6.8 \leq \theta_1/\theta_2 \leq 6.8 \quad \text{equation (11);}$$

$$\text{if } \Delta\phi = 7\pi/36, 1/2.5 \leq \theta_1/\theta_2 \leq 2.5 \quad \text{equation (12);}$$

$$\text{if } \Delta\phi = 2\pi/9, 1/1.6 \leq \theta_1/\theta_2 \leq 1.6 \quad \text{equation (13);}$$

$$\text{if } \Delta\phi = \pi/4, 1/1.2 \leq \theta_1/\theta_2 \leq 1.2 \quad \text{equation (14); and}$$

$$\text{if } \Delta\phi = 23\pi/90, 1/1.1 \leq \theta_1/\theta_2 \leq 1.1 \quad \text{equation (15).}$$

However, the reflectance cannot be set 15% or less in a case of $\Delta\phi \geq 47\pi/180$. Taking these into consideration, it is possible to set the reflectance to 15% or below by satisfying any of the following equations (4) through (8) and (16):

$$\text{if } \Delta\phi \leq 7\pi/45, 1/25.8 \leq \theta_1/\theta_2 \leq 25.8 \quad \text{equation (4);}$$

$$\text{if } \Delta\phi \leq \pi/6, 1/6.8 \leq \theta_1/\theta_2 \leq 6.8 \quad \text{equation (5);}$$

$$\text{if } \Delta\phi \leq 7\pi/36, 1/2.5 \leq \theta_1/\theta_2 \leq 2.5 \quad \text{equation (6);}$$

$$\text{if } \Delta\phi \leq 2\pi/9, 1/1.6 \leq \theta_1/\theta_2 \leq 1.6 \quad \text{equation (7);}$$

$$\text{if } \Delta\phi \leq \pi/4, 1/1.2 \leq \theta_1/\theta_2 \leq 1.2 \quad \text{equation (8); and}$$

$$\text{if } \Delta\phi \leq 23\pi/90, 1/1.1 \leq \theta_1/\theta_2 \leq 1.1 \quad \text{equation (16).}$$

Thus, it is possible to obtain the higher scattering property of the light L in the light-emitting device 10 than in the light-emitting device 100 in accordance with the conventional technique.

In addition, the use of the light-emitting device in accordance with the present embodiment makes it possible to provide a lighting device having this light-emitting device. With the lighting device having the light-emitting device in accordance with the present embodiment, it is possible to provide the lighting device having the higher scattering ability obtained by lowering the reflectance caused by the Fresnel's reflection. Specific examples of the lighting device are a liquid crystal device, a backlight, a signboard, and the like.

In a case where the aforesaid arrangement is used as a backlight for a liquid crystal display device, it is possible to emit the light to the plane above the light emitting device 10 and perpendicular to the light axis Z in such a manner that the light is more smoothly distributed over the plane in a direction away from the light-emitting element 1, as compared to a light flux controlling member not arranged in accordance with the present embodiment. The plane is a plane on which a liquid crystal display panel, not illustrated, is provided. Thus, it is possible to provide the light-emitting device 10 capable of obtaining the higher scattering ability by lowering the reflectance by the Fresnel's reflection.

Embodiment 2

Figure 10:
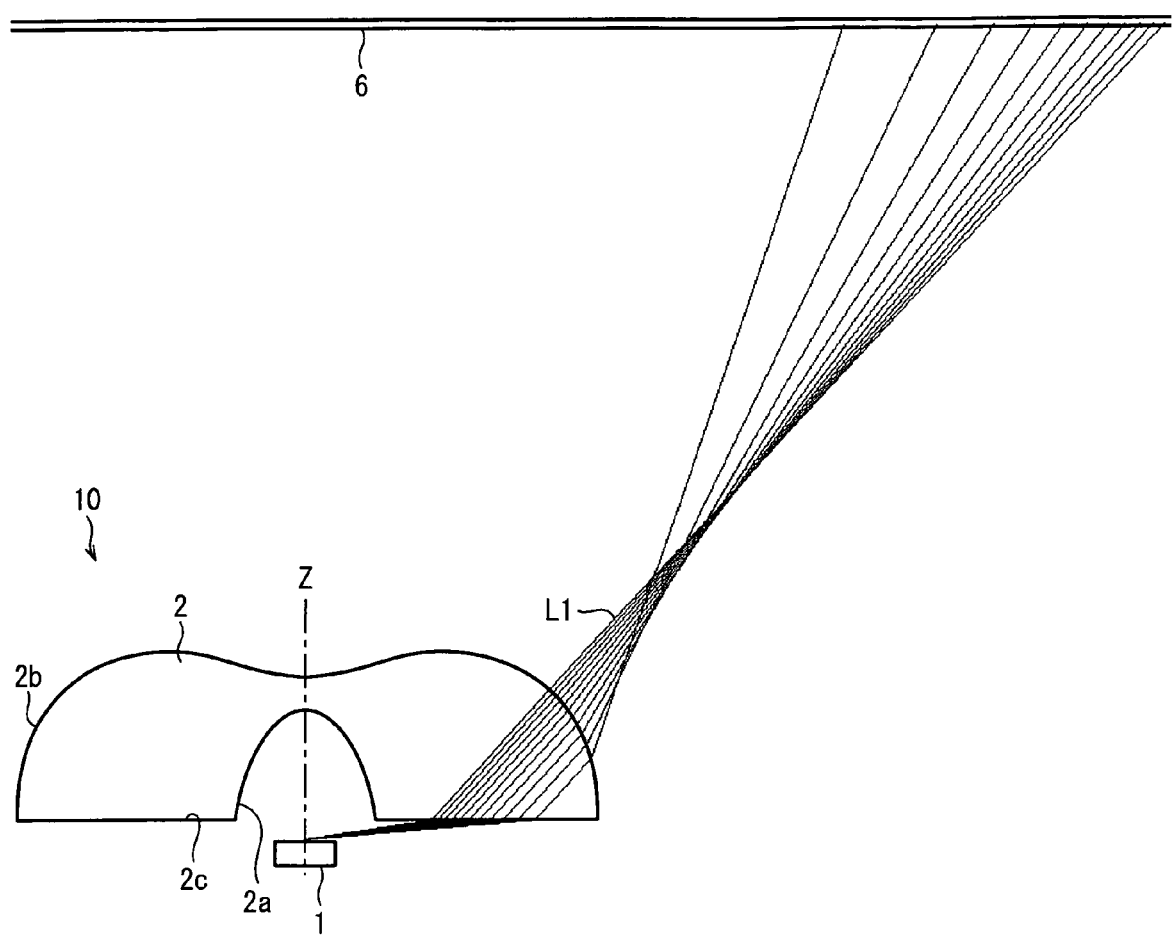
FIG. 10 is a cross-sectional view illustrating an embodiment of the light-emitting device in accordance with the present invention.
Figure 11:
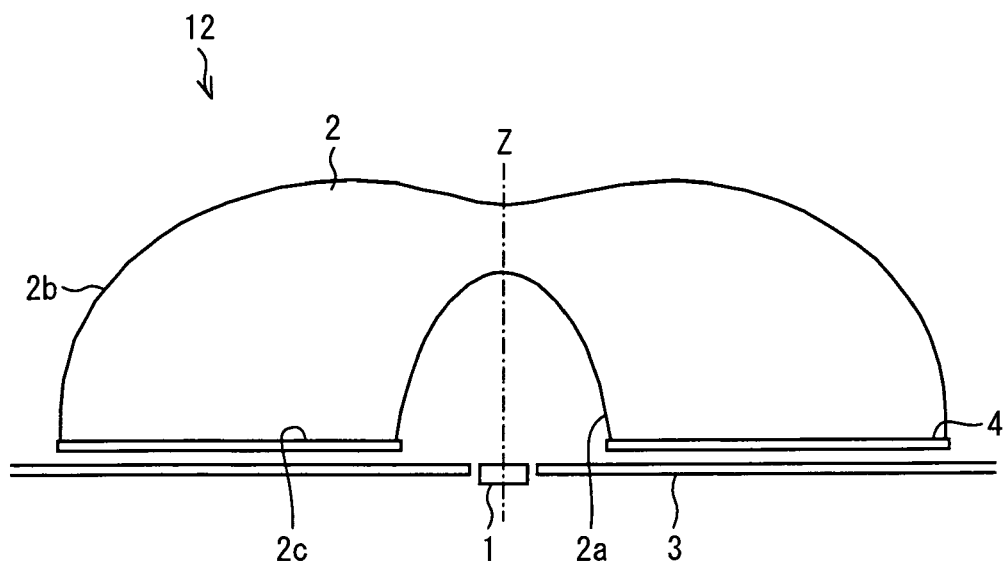
FIG. 11 is a cross-sectional view illustrating another embodiment of the light-emitting device in accordance with the present invention.
Figure 12:
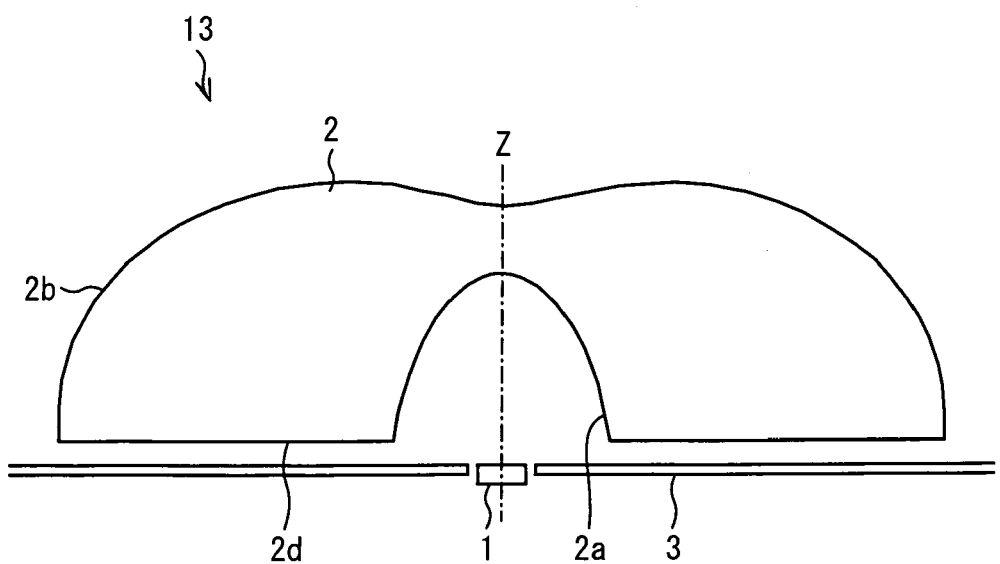
FIG. 12 is a cross-sectional view illustrating another embodiment of the light-emitting device in accordance with the present invention.

The following describes another embodiment in accordance with the present invention, with reference to FIGS. 10 through 12. An arrangement other than described in the present embodiment is the same as that described in Embodiment 1. For an easy explanation, members having the same functions as those shown in figures in Embodiment 1 are given the same reference numerals, and explanations thereof are omitted.

FIG. 10 is a cross-sectional view of a light-emitting device 10 in accordance with the present embodiment. In the light-emitting device illustrated in FIG. 10, a light-emitting element 1 and a light flux controlling member 2 are provided with a certain distance therebetween. In such an arrangement, a part of light emitted from a light-emitting element 1 may directly enter a bottom surface 2c, without entering a light-incoming surface 2a. Subsequently, the light is transmitted through the light flux controlling member 2; is condensed on a light-outgoing surface 2b; and, as light L, enters a liquid crystal display panel, thereby causing a bright line to be generated thereon. The bright line has a circular shape and centers on a part directly above the light-emitting element 1. As a result, an uneven brightness on a liquid crystal display panel 6 may not be improved.

In order to prevent such a phenomenon, the inventor invented a light-emitting device having a reflection preventing section. FIG. 11 is a cross-sectional view of a light-emitting device 12 in accordance with the present embodiment. Unlike the light-emitting device 10 described in Embodiment 1, the light-emitting device 12 has a reflection sheet 3 on a plane that is perpendicular to a light axis Z and encompasses the light-emitting element 1. Besides, a reflection member (light-incoming preventing section) 4 is provided at a lower part of a bottom surface 2c so as to face the reflection sheet 3. An empty space may be formed between the reflection sheet 3 and the reflection member 4.

The reflection sheet 3 can use a conventional reflection sheet. Specific examples of the conventional reflection sheet encompass a film made from a resin such as polyester or the like and added with a white pigment, a film containing a fine bleb therein, and the like. Thus, the reflection sheet 3 is not limited to a particular kind. Also, the reflection member 4 can use a conventional reflection member. Examples of the conventional reflection member encompass a film made from a resin such as polyester or the like and added with a white pigment, a film containing a fine bleb therein, and the like. Thus, the reflection member 4 is not limited to a particular kind.

It is preferable that there is no empty space between the reflection sheet 3 and the reflection member 4 such that the light from the light-emitting element 1 does not directly enter the bottom surface 2c. However, due to quality variations in members constituting the light-emitting device 12, the empty space is formed in practice.

According to the light-emitting device 12, out of the light emitted from the light-emitting element 1, light advancing to the bottom surface 2c from an empty space side is reflected by the reflection member 4. Subsequently, the light enters the reflection sheet 3, and is further reflected by the reflection sheet 3. Thus, the light, emitted from the light-emitting element directly to the bottom surface 2c, is prevented from entering the light flux controlling member 2.

Thus, the light emitted from the light-emitting element 1 is prevented from entering the light flux controlling member 2 undesirably from the bottom surface 2c, thereby reducing the generation of the circular-shaped bright line on the liquid crystal display panel 6. Furthermore, the light thus reflected by the reflection member 4 is reflected by the reflection sheet 3 provided in the vicinity of the light-emitting element 1 so as to be ultimately used for lighting the liquid crystal display panel 6. Thus, a light use efficiency is less likely to be lowered.

The above description explains a method for providing the reflection member as the light-incoming preventing section. As alternative, a light-incoming preventing section may be, as in the light-emitting device 13 shown in FIG. 12, a textured surface 2d prepared by texturing the bottom surface 2c. The textured surface refers to a surface subjected to texturing. An example of the textured surface encompasses a surface subjected to processing so as to have a fine roughness, a printed dot pattern, or the like thereon.

In this arrangement, the light entering the textured surface 2d is scattered, thereby causing the circular-shaped bright line generated on the liquid crystal display panel 6 to be blurred. Thus, the uneven brightness becomes less detectable. Furthermore, with use of a die subjected to texturing, it is possible to provide the textured surface 2d simultaneously as forming the light flux controlling member, thereby allowing a cost reduction.

Embodiment 3

The following describes yet another embodiment in accordance with the present invention, with reference to FIGS. 13 through 18. Arrangements other than described in the present embodiment are the same as those described in Embodiment 1. For convenience, members having the same functions as those shown in the figures in Embodiment 1 are given the same reference numerals, and explanations thereof are omitted.

Figure 13:
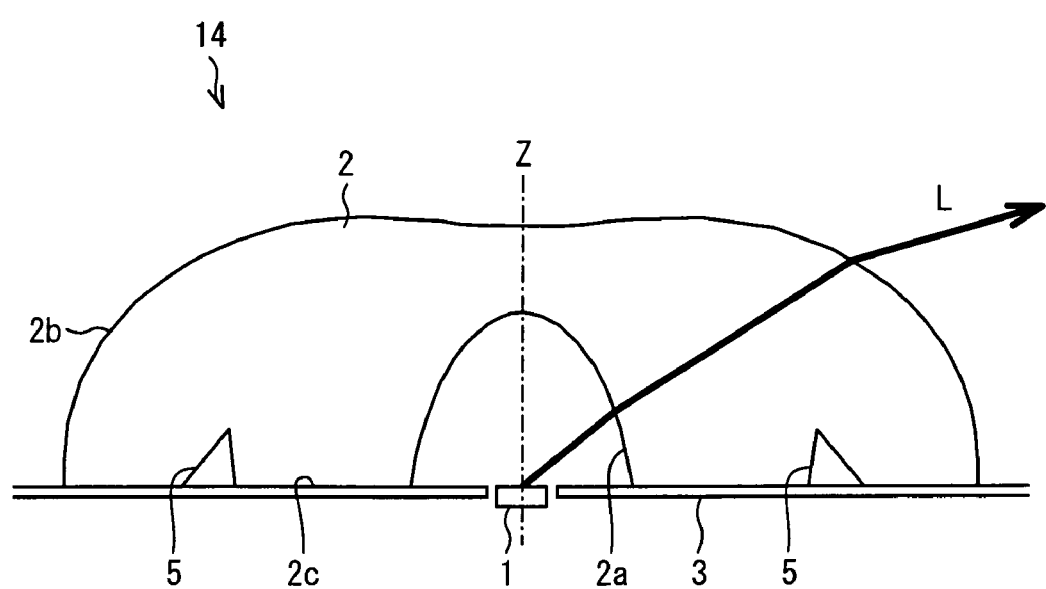
FIG. 13 is a cross-sectional view illustrating another embodiment of the light-emitting device in accordance with the present invention.

FIG. 13 is a cross-sectional view of a light-emitting device 14 in accordance with the present embodiment. The light-emitting device 14 includes a light scattering section 5 of a cuneal shape on a bottom surface 2c. The light scattering section 5 is not limited to a particular kind, provided that the light scattering section 5 (i) reflects light in a same manner as a bezel of a prism having a cuneal shape or the like and (ii) deflects a light direction almost perpendicular to the light axis Z. In FIG. 13, the light scattering section 5 has a rotationally symmetrical shape with respect to the light axis Z and a continuous shape, encircling the light axis Z. As alternative, the light scattering section 5 may be formed partially, encircling the light axis Z.

Figure 14:
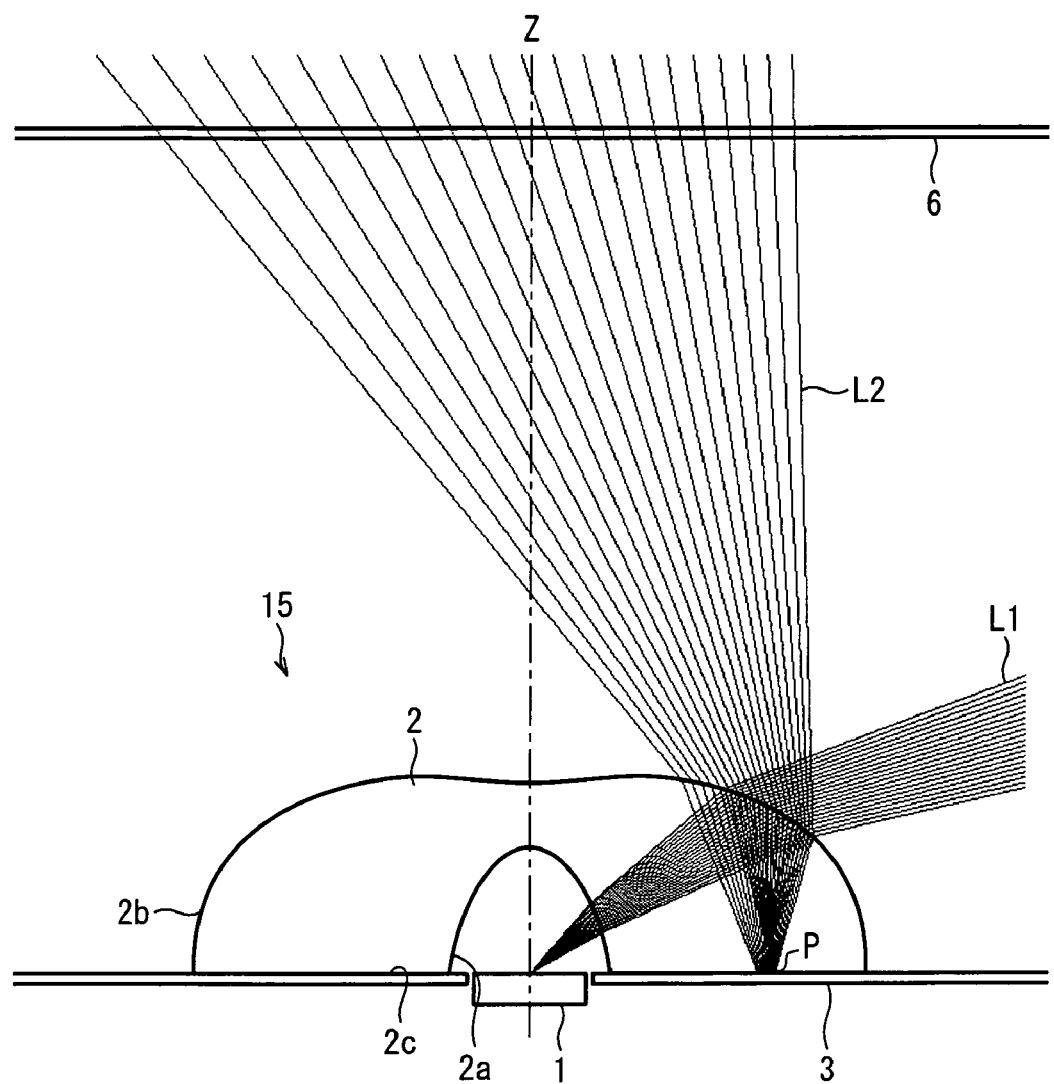
FIG. 14 is a cross-sectional view illustrating another embodiment of the light-emitting device in accordance with the present invention.

In order to provide a detailed explanation of the light scattering section 5, the following description first explains a brightness distribution on a liquid crystal display panel of a light-emitting device that does not have a light scattering section 5. FIG. 14 is a cross-sectional view illustrating a light-emitting device 15 not having a light scattering section 5.

In the light-emitting device 15, light emitted from a light-emitting element 1 enters a light-incoming surface 2a and is subsequently emitted, as light L1, on a light-outgoing surface 2b. However, due to the Fresnel's reflection, a part of the light is not emitted from the light-outgoing surface 2b but reflected. Subsequently, the light is reflected in accordance with the Fresnel's reflection on the bottom surface 2c or refracted by the reflection sheet 3 being in contact with the bottom surface 2c. The light then enters the light-outgoing surface 2b again. The light having been incident on the light-outgoing surface 2b is refracted more parallel to the light axis, and then, as light L2, enters a liquid crystal display panel 6.

Thus, in the light-emitting device 15, it tends to be brighter in the vicinity of the light axis Z on the liquid crystal display panel 6, thereby causing an uneven brightness in the vicinity of the light axis Z.

Figure 15:
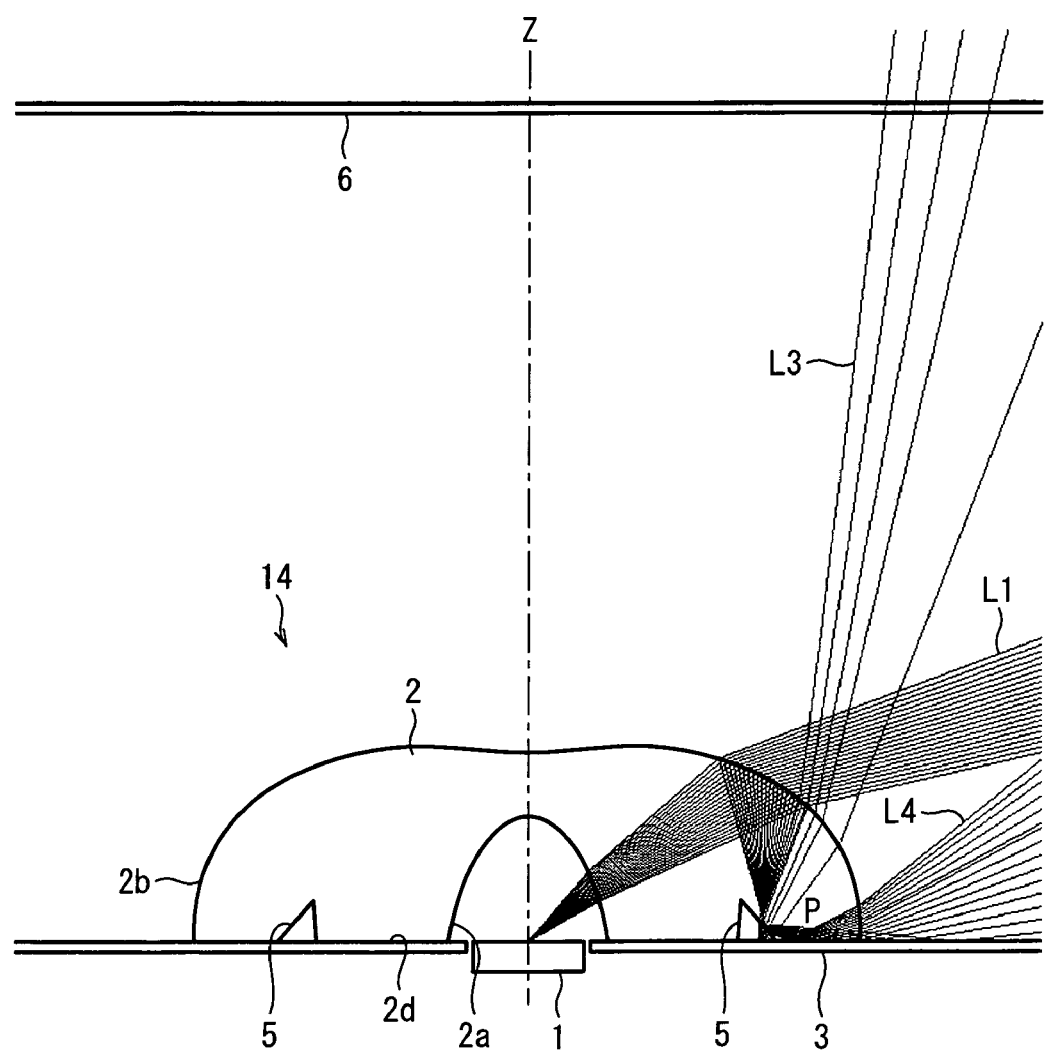
FIG. 15 is a cross-sectional view illustrating another embodiment of the light-emitting device in accordance with the present invention.

Then, the following description explains a brightness distribution on a liquid crystal display panel of a light-emitting device that has a light scattering section 5. FIG. 15 is a cross-sectional view illustrating a light-emitting device 14 that has a light scattering section 5.

In the light-emitting device 14, light emitted from a light-emitting element 1 enters a light-incoming surface 2a, and is subsequently emitted, as light L1, on the light-outgoing surface 2b. However, due to the Fresnel's reflection, a part of the light is not emitted from the light-outgoing surface 2b but reflected as in the case of the light-emitting device 15. The light thus reflected is condensed on a focus point P on a bottom surface 2c. In the light-emitting device 14, a light scattering section 5 is formed in the vicinity of the focus point P, thereby causing the light reflected by the Fresnel's reflection to be condensed on the light scattering section 5. A part of the light condensed on the light scattering section 5 is emitted, as light L3, in a direction almost parallel to the light axis Z. On the other hand, a most part of the light is refracted close into a direction perpendicular to the light axis Z and emitted as light L4. This permits control in which the most part of the light emitted from the light-emitting element 1 is refracted, by the light flux controlling member 2 and the light scattering section 5, close into the direction perpendicular to the light axis Z. Thus, by the light-emitting device having the light scattering section 5, it is possible to further prevent the uneven brightness.

A position at which the light scattering section 5 is disposed is not particularly limited, provided that the light scattering section 5 refracts a more amount of the light from the light-outgoing surface 2b almost along the direction perpendicular to the light axis Z. In particular, it is preferable to provide the light scattering section 5 at the focus point P, since this allows a prism of a smaller shape to refract, almost along the direction perpendicular to the light axis Z, a more amount of the light reflected by the Fresnel's reflection on the light-outgoing surface 2b. The focus point P is disposed, on the bottom surface 2c, roughly at a position near to the light-outgoing surface 2b.

Figure 16:
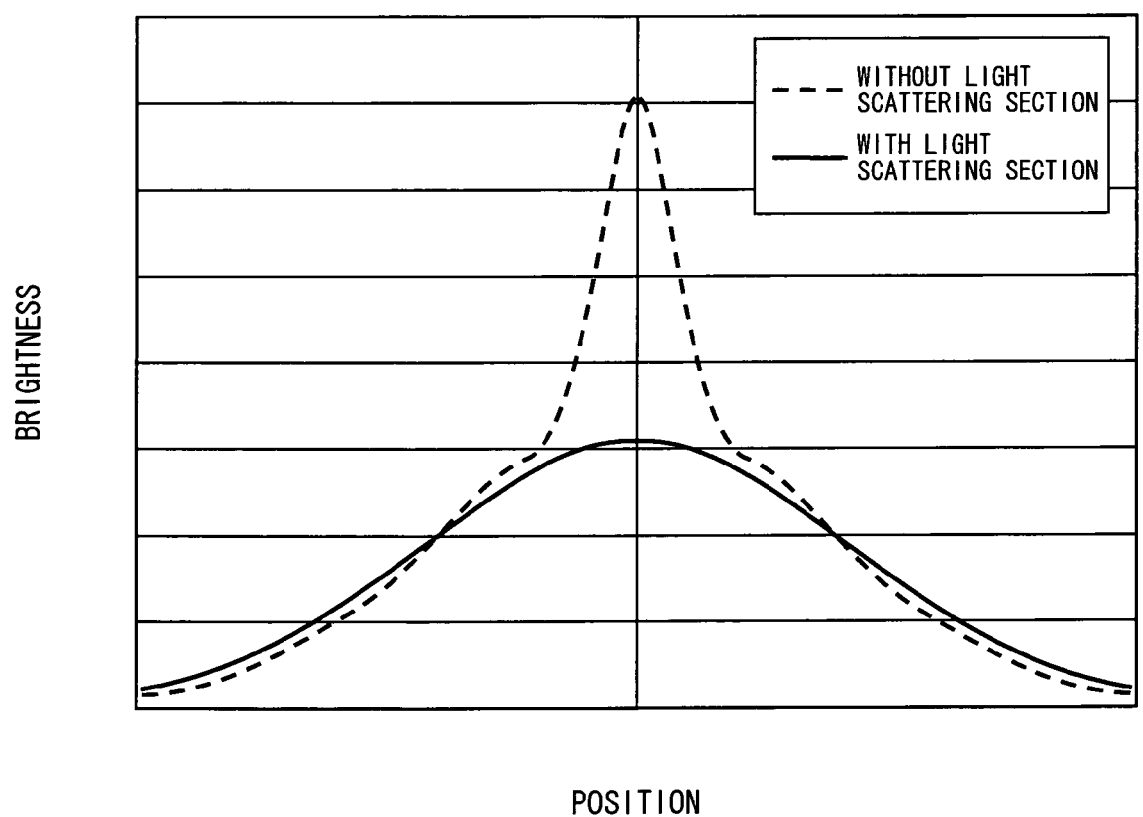
FIG. 16 is a graph showing a brightness distribution over the liquid crystal display panel in a case where the light-emitting device in accordance with the present invention is used.

FIG. 16 is a graph showing a brightness distribution on the liquid crystal display panel 6 in the cases where the light-emitting devices 14 and 15 are used, respectively. In FIG. 16, the vertical axis indicates a relative brightness distribution on the liquid crystal display panel 6, and the horizontal axis indicates a position on the liquid crystal display panel, with a midpoint of the horizontal axis corresponding to a position directly above the light-emitting elements 1 in the light-emitting devices. In FIG. 16, the actual line indicates the brightness distribution of the light-emitting device 14 having the light scattering section 5, and the dashed line indicates the brightness distribution of the light-emitting device 15 not having the light scattering section 5.

Comparison between the actual line and the dashed line in FIG. 16 demonstrates that, in the light-emitting device 14 having the light scattering section 5, the brightness is reduced further in the area above of the light-emitting element 1, as compared to the light-emitting device 15. A brightness level of the area directly above the light emitting-element 1, which is indicated by the dashed line in FIG. 16, causes the uneven brightness in which it gets brighter in the area directly above the light-emitting element. Thus, as described above, the provision of the light scattering section 5 in the light-emitting device 14 makes the uneven brightness less likely to be generated on the liquid crystal display panel 6.

Figure 17:
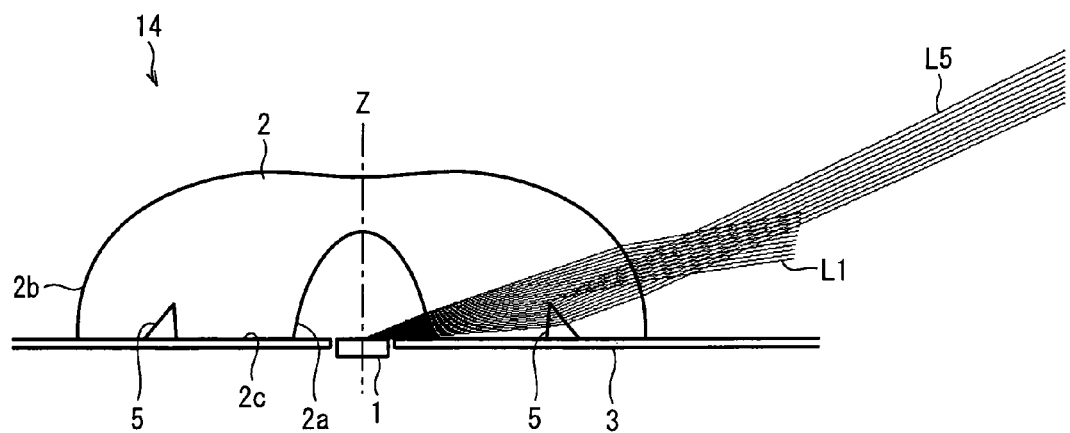
FIG. 17 is a cross-sectional view illustrating another embodiment of the light-emitting device in accordance with the present invention.

FIG. 17 is a cross-sectional view illustrating the light-emitting device 14 of a case where the light having been incident on the light-incoming surface 2a reaches the light scattering section 5 before reaching the light-outgoing surface 2b.

As described above, in the light-emitting device 14, the light from the light-emitting element 1 is emitted as the light L1, if emitted from the light-outgoing surface 2b before reaching the light scattering section 5. In this way, the scattering property of the light emitted from the light-emitting element is improved. As shown in FIG. 17, a part of the light emitted from the light-emitting element 1 reaches the light scattering section 5 after entering the light-incoming surface 2a. Subsequently, the light enters the light-outgoing surface 2b, and then is externally emitted, as light L5, from the light flux controlling member 2. As shown in FIG. 17, after entering the light-incoming surface 2a, the part of the light from the light-emitting element 1 is refracted, by the light scattering section 5, into a direction side that is parallel to the light axis Z direction. That is, generation of the light L5 decreases an efficiency at which the scattering property of the light from the light-emitting element 1 is improved.

Figure 18:
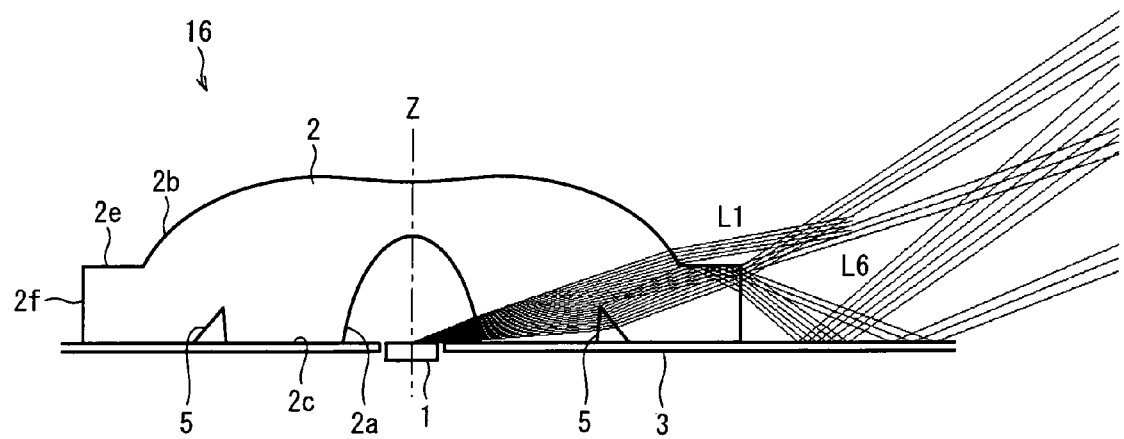
FIG. 18 is a cross-sectional view illustrating an embodiment of the light-emitting device in accordance with the present invention, which light-emitting device has a light scattering surface.

In order to further improve the light scattering property by preventing the generation of such light L5, the inventor invented the following light-emitting device. FIG. 18 shows a cross-sectional view of a light-emitting device 16 having a light scattering surface 2e.

A light flux controlling member 2 of the light-emitting device 16 has a light scattering surface 2e that has a surface perpendicular to a light axis Z, in a side (an external side) from which light from a light-emitting element 1 is emitted on a light-outgoing surface 2b. An end surface 2f vertical to a bottom surface 2c is formed on an edge part of the external side of the light scattering surface 2e, making contact with the bottom surface 2c.

As shown in FIG. 18, the light, emitted from the light-emitting element 1, entering the light-incoming surface 2a, and reaching the light scattering section 5 before reaching the light-outgoing surface 2b, is scattered on the light scattering surface 2e, as light L6. As such, it is possible to prevent the generation of the ring-shaped bright line caused by such light as the light L5 shown in FIG. 17, which is refracted in the direction side parallel to the light axis Z. Thus, the light from the light-emitting element 1 can be more efficiently scattered. Specifically, according to the light-emitting device 16, a degree at which the light emitted to the liquid crystal display panel causes the circular shaped bright line in a particular area is lowered. That is, the installation of the light scattering surface 2e makes it easier to prevent the uneven brightness.

In a case where the bright spot and/or the bright line is generated despite the adoption of the above countermeasures, a lens should be designed in accordance with a new brightness objective that is set in consideration of the generation of the bright spot and/or the bright line. The new brightness objective is set by lowering the brightness of a local area in the Gaussian distribution, where the bright spot and/or the bright line is generated.

The present invention is not limited to the description of the embodiments above, but may be altered by a skilled person within the scope of the claims. An embodiment based on a proper combination of technical means disclosed in different embodiments is encompassed in the technical scope of the present invention.

As described above, a light-emitting device in accordance with the present invention is arranged such that the light-incoming surface has a concave curve part that is axisymmetrical with respect to a reference light axis of the light-emitting device, and the light-outgoing surface has (i) a convex curve part that is axisymmetrical with respect to the reference light axis and (ii) a recession continuing to the convex curve part, on a part encompassing an intersection of the reference light axis and the light-outgoing surface, and (x) $R_1$ monotonically decreases as $\alpha_1$ increases, at least in a range of $\alpha_1 < \pi/3$, where an intersection of the reference light axis and an emission surface of the light-emitting element is a reference point, $\alpha_1$ is an angle between the reference light axis and a straight line that passes through the reference point and an arbitrary point on the light-incoming surface, and $R_1$ is a distance between the reference point and the arbitrary point on the light-incoming surface; (y) $R_2$ monotonically increasing as $\alpha_2$ increases, at least in a range of $\alpha_2 < \pi/3$, where $\alpha_2$ is an angle between the reference light axis and a straight line that passes through the reference point and an arbitrary point on the light-outgoing surface, and $R_2$ is a distance between the reference point and the arbitrary point on the light-outgoing surface; and (z) $A_2 < 1/\sqrt{n^2-1}$, where n is a refraction index of a material forming the light flux controlling member, and $A_2 = \Delta R_2/(R_2 \Delta \alpha_2)$, where $\Delta R_2$ is an increment of $R_2$ and $\Delta \alpha_2$ is an increment of $\alpha_2$.

Thus, it is possible to obtain the effect of scattering the light emitted from the light-emitting element smoothly over the wide range.

It is preferable that the light-emitting device is arranged such that the light flux controlling member is made from a transparent material having a refraction index of not less than 1.45 and not more than 1.65.

The light flux controlling member is made from the transparent material having the refraction index of not less than 1.45 and not more than 1.65. As such, a material encompassing acrylic, polycarbonate, or the like can be usable. Thus, a cost reduction can be achieved.

Furthermore, it is preferable that, on the light-incoming surface, $A_1$ is 0 when $\alpha_1$ is 0, where $A_1 = \Delta R_1/(R_1 \Delta \alpha_1)$ where $\Delta \alpha_1$ is an increment of $\alpha_1$ and $\Delta R_1$ is an increment of $R_1$; and, on the light-outgoing surface, $A_2$ is 0 when $\alpha_2$ is 0.

This prevents it from being darker in the vicinity of the light axis of the light-emitting device. Thus, the uneven brightness can be prevented.

Furthermore, it is preferable that the light-emitting device in accordance with the present invention is arranged such that, on the light-incoming surface, a maximum value of $A_1$ is obtained when $\alpha_1$ is in a range between 0 and $\pi/4$.

This prevents the light from being condensed in the vicinity of the light axis of the light-emitting device, on the liquid crystal display panel. Thus, the uneven brightness can be prevented.

That is, since the maximum value of $A_1$ is obtained when $\alpha_1$ is in the range between 0 to $\pi/4$, it is possible to further improve the scattering property by (i) rapidly increasing a light refraction angle in the vicinity of the light axis, where the light from the light-emitting element is condensed, so that the light amount on the light axis of the light-emitting device decreases and by (ii) moderately setting back the light refraction angle in the area away from the light refraction axis. This causes the light-emitting device to produce the smooth brightness distribution. Thus, the uneven brightness can be prevented, when a plurality of the light-emitting devices are provided.

It is preferable that a light-emitting device in accordance with the present invention is arranged such that the light flux controlling member has a bottom surface that interconnects the light-incoming surface and the light-outgoing surface to each other; on which bottom surface, a light-incoming preventing section for preventing an incidence of the light emitted from the light-emitting element is provided.

This causes the light-incoming preventing section to prevent the light, emitted from the light-emitting element, from entering the bottom surface. Thus, it is possible to prevent the generation of the uneven brightness caused by the light-emitting device while the light enters the light flux controlling member from the undesirable direction.

It is preferable that a light-emitting device in accordance with the present invention is arranged such that the light-incoming preventing section is a textured section prepared by texturing the bottom surface of the light flux controlling member.

This allows forming the light-incoming preventing section simultaneously as forming the light flux controlling section. Thus, it is possible to form the light-incoming preventing section at a lower cost.

A lighting device in accordance with the present invention comprises a light-emitting device.

Thus, it is possible to provide the lighting device having the improved scattering property that is obtained by decreasing the reflectance by the Fresnel's reflection.

A lighting device in accordance with the present invention can be used as a backlight for a liquid crystal display device. The lighting device in accordance with the present invention can be suitably used, in particular, as a backlight for a liquid crystal display device of a large size.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A light-emitting device, comprising:
    a light-emitting element and
    a light flux controlling member for controlling light emitted from the light-emitting element,
    the light flux controlling member having (i) a light-incoming surface from which the light from the light-emitting element enters the light flux controlling member and (ii) a light-outgoing surface from which the light being incident on the light-incoming surface is emitted from the light flux controlling member,
    the light-incoming surface having a concave curve part that is axisymmetrical with respect to a reference light axis of the light-emitting device, and the light-outgoing surface having (i) a convex curve part that is axisymmetrical with respect to the reference light axis and (ii) a recession continuing to the convex curve part, on a part encompassing an intersection of the reference light axis and the light-outgoing surface;
    $R_1$ monotonically decreasing as $\alpha_1$ increases, at least in a range of $\alpha_1 < \pi/3$, where an intersection of the reference light axis and an emission surface of the light-emitting element is a reference point; $\alpha_1$ is an angle between the reference light axis and a straight line that passes through the reference point and an arbitrary point on the light-incoming surface; and $R_1$ is a distance between the reference point and the arbitrary point on the light-incoming surface;
    $R_2$ monotonically increasing as $\alpha_2$ increases, at least in a range of $\alpha_2 < \pi/3$, where $\alpha_2$ is an angle between the reference light axis and a straight line that passes through the reference point and an arbitrary point on the light-outgoing surface; and $R_2$ is a distance between the reference point and the arbitrary point on the light-outgoing surface; and
    $A_2 < 1/\sqrt{n^2-1}$, where n is a refraction index of a material forming the light flux controlling member; and $A_2 = \Delta R_2/(R_2 \Delta \alpha_2)$, where $\Delta R_2$ is an increment of $R_2$ and $\Delta \alpha_2$ is an increment of $\alpha_2$.

2. The light-emitting device as set forth in claim 1, wherein:
    the light flux controlling member is made from a transparent material having a refraction index of not less than 1.45 and not more than 1.65.

3. The light-emitting device as set forth in claim 1, wherein:
    on the light-incoming surface, $A_1$ is 0 when $\alpha_1$ is 0, where $A_1 = \Delta R_1/(R_1 \Delta \alpha_1)$ where $\Delta \alpha_1$ is an increment of $\alpha_1$ and $\Delta R_1$ is an increment of $R_1$; and
    on the light-outgoing surface, $A_2$ is 0 when $\alpha_2$ is 0.

4. The light-emitting device as set forth in claim 3 wherein:
    on the light-incoming surface, a maximum value of $A_1$ is obtained when $\alpha_1$ is in a range between 0 and $\pi/4$.

5. The light-emitting device as set forth in claim 1, wherein:
    the light flux controlling member has:
    a bottom surface that interconnects the light-incoming surface and the light-outgoing surface to each other; and
    on which bottom surface, a light-incoming preventing section for preventing an incidence of the light emitted from the light-emitting element is provided.

6. The light-emitting device as set forth in claim 5, wherein:
    the light-incoming preventing section is a textured section prepared by texturing the bottom surface of the light flux controlling member.

7. A lighting device comprising a light-emitting device as set forth in claim 1.

* * * * *